(12) United States Patent
Numakura

(10) Patent No.: US 9,054,628 B2
(45) Date of Patent: Jun. 9, 2015

(54) POWER INVERTER

(75) Inventor: Yuta Numakura, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 139 days.

(21) Appl. No.: 13/993,274

(22) PCT Filed: Dec. 7, 2011

(86) PCT No.: PCT/JP2011/078330
§ 371 (c)(1),
(2), (4) Date: Jun. 11, 2013

(87) PCT Pub. No.: WO2012/090666
PCT Pub. Date: Jul. 5, 2012

(65) Prior Publication Data
US 2013/0278194 A1    Oct. 24, 2013

(30) Foreign Application Priority Data

Dec. 27, 2010   (JP) ................................. 2010-289091

(51) Int. Cl.
| | |
|---|---|
| H02P 6/14 | (2006.01) |
| H02P 27/08 | (2006.01) |
| B60L 3/00 | (2006.01) |
| H05K 7/14 | (2006.01) |
| H02M 7/00 | (2006.01) |

(52) U.S. Cl.
CPC ................. *H02P 27/08* (2013.01); *B60L 3/003* (2013.01); *H02M 7/003* (2013.01); *H05K 7/1432* (2013.01)

(58) Field of Classification Search
USPC ....................... 318/400.27; 363/141; 701/122
See application file for complete search history.

(56) References Cited

U.S. PATENT DOCUMENTS

| | | | |
|---|---|---|---|
| 2008/0186751 A1 | 8/2008 | Tokuyama et al. | |
| 2008/0251909 A1 | 10/2008 | Tokuyama et al. | |
| 2009/0231811 A1 | 9/2009 | Tokuyama et al. | |
| 2014/0140119 A1* | 5/2014 | Shinohara et al. | ............ 363/141 |

FOREIGN PATENT DOCUMENTS

| | | |
|---|---|---|
| JP | 8-336281 A | 12/1996 |
| JP | 2008-193867 A | 8/2008 |
| JP | 2008-259267 A | 10/2008 |
| JP | 2009-159815 A | 7/2009 |
| JP | 2009-219270 A | 9/2009 |

OTHER PUBLICATIONS

Corresponding International Search Report with English Translation dated Mar. 13, 2012 (four (4) pages).

* cited by examiner

*Primary Examiner* — Karen Masih
(74) *Attorney, Agent, or Firm* — Crowell & Moring LLP

(57) ABSTRACT

There is provided a power inverter that fixes a connector in which a DC-side connector and an AC-side connector are mechanically combined to a casing in which a power semiconductor module converting a DC current into an AC current is housed, a positive-side DC terminal and a negative-side DC terminal are arranged to be aligned along one side, which is formed in the widthwise direction, of one side face of the casing, and a U-phase side terminal, a V-phase side terminal, and a W-phase side terminal are arranged to be aligned along one side, which is formed in the longitudinal direction, of one side face of the casing.

11 Claims, 20 Drawing Sheets

POWER INVERTER

TECHNICAL FIELD

The present invention relates to a power inverter that is used for converting DC power to AC power or AC power to DC power.

BACKGROUND ART

Generally, a power inverter includes a smoothing capacitor module that receives DC power from a DC power source, an inverter circuit that receives DC power from the capacitor module and generates AC power, and a control circuit that is used for controlling the inverter circuit. The AC power, for example, is supplied to an electrical motor, and the electrical motor generates rotating torque in accordance with the supplied AC power. Generally, the electrical motor has a function of a generator, and, when mechanical energy is supplied to the electrical motor from the outside, the electrical motor generates AC power based on the supplied mechanical energy. In many cases, the above-described power inverter has a function for converting AC power into DC power, and the AC power generated by the electrical motor is converted into DC power. The conversion from DC power to AC power or the conversion from AC power to DC power is controlled by the control device. For example, when the electrical motor is a synchronous electrical motor, by controlling the phase of a rotating magnetic field generated by a stator with respect to a magnetic pole position of a rotor of the synchronous electrical motor, the control relating to the power conversion can be performed. An example of the power inverter is disclosed in PTL 1.

The power inverter, for example, is built in a vehicle, receives DC power from a secondary battery built in the vehicle and generates AC power to be supplied to an electrical motor generating rotating torque for driving. In addition, when the vehicle is in a regenerative braking operation, in order to generate a braking force, the electrical motor generates AC power based on drive energy, and the generated AC power is converted into DC power by the power inverter, which is charged in the secondary battery and is used again as power for driving the vehicle.

CITATION LIST

Patent Literature

PTL 1: JP 2009-219270 A

SUMMARY OF INVENTION

Technical Problem

From a viewpoint of an environmental measure or the like, the importance of power inverters converting DC power into AC power for driving electrical motors increases more and more. In power inverters, further improvement of the reliability of connections of wirings is required. In other words, since vibrations according to vehicle driving or vibrations according to vehicle driving sources are delivered to the power inverters, it is desirable to improve vibration resistance of the power inverters.

An object of the present invention is to provide a power inverter of which the vibration resistance is further improved.

Solution to Problem

According to a first aspect of the present invention, a power inverter that fixes a connector, in which a DC-side connector and an AC-side connector are mechanically combined, to a casing includes: a power semiconductor module that converts a DC current into an AC current; a DC terminal that delivers the DC current to the power semiconductor module; an AC terminal that delivers the AC current to an electrical motor; and the casing that houses the power semiconductor module, in which the DC terminal and the AC terminal are arranged on one side face of the casing, the one side face of the casing forms a rectangular shape that is configured by a side formed in a widthwise direction and a side formed in a longitudinal direction, the DC terminal is configured by a positive-side DC terminal and a negative-side DC terminal, the AC terminal is configured by a U-phase side terminal, a V-phase side terminal, and a W-phase side terminal, the positive-side DC terminal and the negative-side DC terminal are arranged to be aligned along one side, which is formed in the widthwise direction, of the one side face of the casing, and the U-phase side terminal, the V-phase side terminal, and the W-phase side terminal are arranged to be aligned along one side, which is formed in the longitudinal direction, of the one side face of the casing.

According to a second aspect of the present invention, in the power inverter according to the first aspect, it is preferable that one of the U-phase side terminal, the V-phase side terminal, and the W-phase side terminal be arranged to be closer to the other side, which is formed in the longitudinal direction, of the one side face of the casing than the other two terminals.

According to a third aspect of the present invention, the power inverter according to the first or second aspect further includes a first support member that supports the AC terminal, in which it is preferable the casing form a first opening portion on the one side face and the first support member close the first opening portion from an inner wall side of the casing and be supported by the inner wall of the casing.

According to a fourth aspect of the present invention, in the power inverter according to the third aspect, it is preferable that the casing include a first wall that protrudes from an edge of the first opening portion toward an outside of the casing, and the AC-side connector of the connectors pass through a space surrounded by the first wall and is connected to the AC terminal supported by the first support member.

According to a fifth aspect of the present invention, the power inverter according to the third aspect further includes a second support member that supports the DC terminal, in which it is preferable that the casing form a second opening portion on the one side face and the second support member close the second opening portion from the inner wall side of the casing and be supported by the inner wall of the casing.

According to a sixth aspect of the present invention, in the power inverter according to the fifth aspect, it is preferable that the casing include a second wall that protrudes from an edge of the second opening portion toward the outside of the casing and the DC-side connector of the connectors pass through a space surrounded by the second wall and is connected to the DC terminal supported by the second support member.

According to a seventh aspect of the present invention, the power inverter according to the fifth aspect further includes: a control circuit board that controls driving of the power semiconductor module; and a connection detecting circuit that detects a state in which the connector is electrically disconnected from the DC terminal and the AC terminal, in which it is preferable that the connection detecting circuit be connected to at least one of the first support member and the second support member and the control circuit board suppresses or stops the driving of the power semiconductor module based on a signal transmitted from the connection detecting circuit.

According to an eighth aspect of the present invention, in the power inverter according to the third aspect, it is preferable that the first support member include a first protruded portion that protrudes toward the outside of the casing and the first support member be fixed to the inner wall of the casing in a state in which the first protruded portion is brought into contact with an inner circumference portion of the first opening portion of the casing.

According to a ninth aspect of the present invention, the power inverter according to the first aspect further includes a first support member that supports the AC terminal, in which it is preferable that the casing form a first opening portion on the one side face, the first support member be supported by the inner wall side of the casing at a position facing the first opening portion, and the first support member include a terminal covering portion that protrudes toward the outside of the casing and is configured to cover a distal end portion of the AC terminal.

According to a tenth aspect of the present invention, the power inverter according to the first aspect further includes: a control circuit board that controls driving of the power semiconductor module; an AC busbar that delivers the AC current flowing between the power semiconductor module and the AC terminal; a first support member that supports the AC terminal; and a metal plate that fixes the first support member to the casing by sandwiching the first support member between the casing and the metal plate, in which it is preferable that the casing form a first opening portion on the one side face, the first support member be supported by the inner wall side of the casing at a position facing the first opening portion, and the metal plate be formed to cover at least a part of a face of the AC busbar disposed on a side on which the control circuit board is arranged.

Advantageous Effects of Invention

According to the present invention, the vibration resistance of a power inverter can be improved.

BRIEF DESCRIPTION OF DRAWINGS

FIG. 7(a) is a perspective view, and FIG. 7(b) is a cross-sectional view, similarly to FIG. 6(b), acquired when the power semiconductor module is cut in cross-section D and viewed in direction E. FIG. 7(c) is a cross-sectional view before a fin 305 is pressed to deform a bending portion 304A.

FIG. 8(a) is a perspective view, and FIG. 8(b) is a cross-sectional view, similarly to FIGS. 6(b) and 7(b), acquired when the power semiconductor module is cut in cross-section D and viewed in direction E.

DESCRIPTION OF EMBODIMENTS

Figure 1:
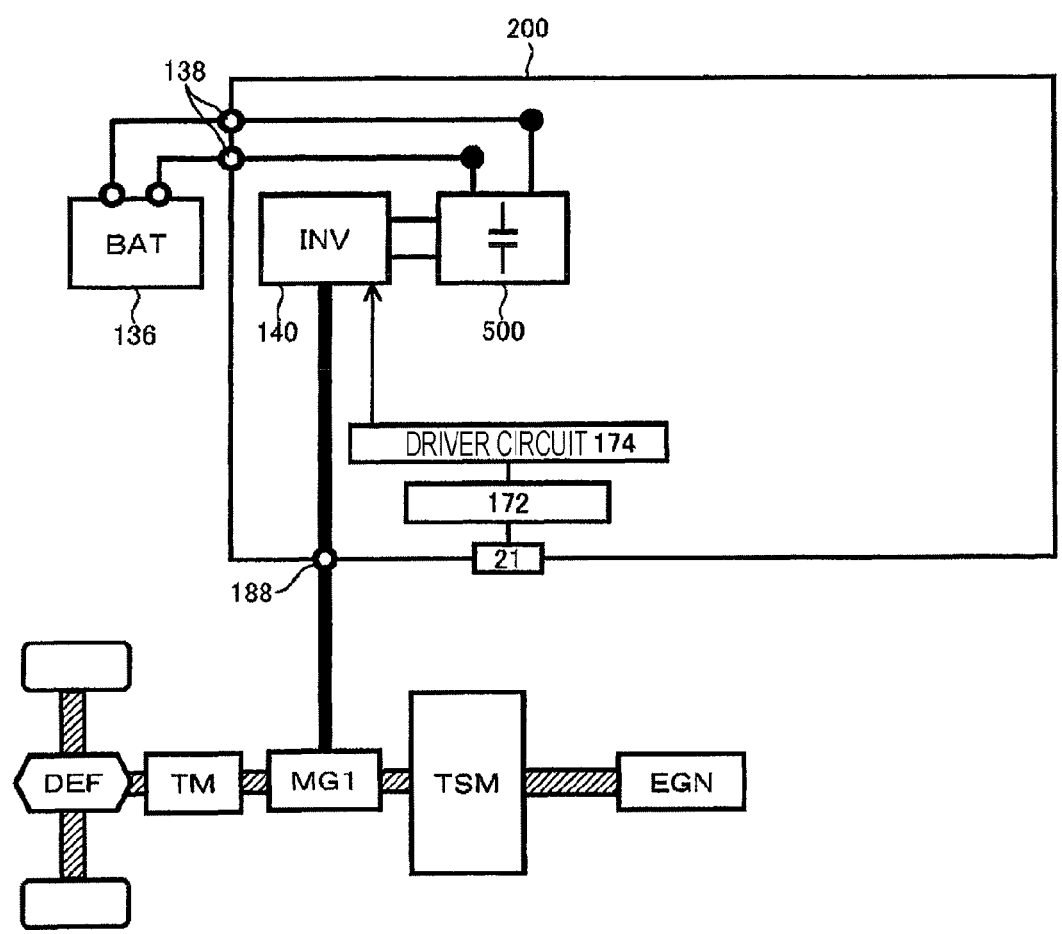
FIG. 1 is a system diagram that illustrates the system of a hybrid electrical vehicle.

Hereinafter, three exemplary embodiments of a current conversion device for achieving an object of the present invention will be simply described. Power inverters according to embodiments of the present invention and systems using these devices, to be described as below, solve various problems that are desirable to be solved for productization. As one of the various problems solved by the embodiment, there is a problem relating to improvement of vibration resistance described in "Technical Problem" described above, and, not only the effect of the improvement of vibration resistance described in the above-described "Advantageous Effects of Invention" but also various problems other than the problems and the advantageous effects described above are solved, whereby various advantageous effects can be achieved.

A power inverter according to a first embodiment of the present invention is a power inverter in which a connector, in which a DC-side connector and an AC-side connector are mechanically combined, is fixed to a casing that houses a power semiconductor module converting a DC current into an AC current, a positive-side DC terminal and a negative-side DC terminal are arranged to be aligned along one side of one side face of the casing in the widthwise direction, and a U phase-side terminal, a V phase-side terminal, and a W phase-side terminal are arranged so as to be aligned along one side of one side face of the casing in the longitudinal direction.

According to this embodiment, the bias of the insertion stress of the connector is suppressed, whereby vibration resistance of the positive-side DC terminal, the negative-side DC terminal, and the AC terminal can be improved.

In addition, a problem relating to the improving of the vibration resistance described in "Technical Problem" described above can be also solved by embodiments other than the first embodiment described above, and the above-described advantages can be acquired.

In other words, in the first embodiment that solves the problem relating to the improving of the vibration resistance and acquires the above-described advantages, the problem is solved from a different viewpoint, and advantages are acquired.

A second embodiment that is another embodiment for achieving the desired object of the improvement of vibration resistance will be described next. The second embodiment includes a support member that supports an AC terminal and a casing that forms an opening portion, and the casing further includes a wall protruding toward the outer side of the casing from the edge of the opening portion, and a support member closes the first opening portion from the inner wall side of the casing, and an AC wiring connected to the electrical motor side passes through a space surrounded by the wall and is connected to the AC terminal supported by the support member. By employing such a configuration, the support member is brought into contact with the casing to a degree for closing the opening portion of the casing, and the AC wiring is supported by the wall protruding from the casing, whereby the resonance frequency of the AC terminal and the AC wiring can be configured to be higher than the frequency of vibration transferred from an engine or the like.

A third embodiment for achieving an object of miniaturization will be described next. The third embodiment includes: a capacitor circuit unit that smooth a DC current; a cooling block that forms a flow path through which cooling coolant flows; a power semiconductor module that is supplied with a DC current output from the capacitor circuit unit and supplies a three-phase AC current to an electrical motor; a casing that houses the capacitor circuit unit, the cooling block, and the power semiconductor module; and an electrical circuit that is electrically connected to the capacitor circuit unit and the DC terminal in series or in parallel, the cooling block forms a first flow path and a second flow path, and the first and second flow paths are arranged to be parallel to each other with the capacitor circuit unit interposed therebetween, the power semiconductor module is configured to include a first power semiconductor module that outputs a first-phase AC current, a second power semiconductor module that outputs a second-phase AC current, and a third power semiconductor module that outputs a third-phase AC current, and the first and second power semiconductor modules are fixed to be aligned in the first flow path along the flow direction of the cooling coolant flowing through the first flow path, the third power semiconductor module is fixed to the second flow path so as to face the first power semiconductor module through the capacitor circuit unit, and the electrical circuit device is arranged at a position facing the second power semiconductor module through the capacitor circuit unit. By employing such a configuration, even when two power semiconductor modules disposed for each phase are arranged on one side face of the capacitor circuit unit, and one power semiconductor module is arranged on the other side face, the power semiconductor modules and the capacitor circuit unit are orderly configured, and the cooling capability of the coolant path can be sufficiently drawn.

Hereinafter, power conversion inverters according to the present invention including the above-described three embodiments and other embodiments will be described in detail.

Hereinafter, an embodiment according to the present invention will be described with reference to the drawings. FIG. 1 is a diagram that illustrates a control block of a hybrid electrical vehicle (hereinafter, referred to as an "HEV"). An engine EGN and a motor generator MG1 generate torque for driving a vehicle. In addition, the motor generator MG1 not only generates rotating torque but has a function for converting mechanical energy that is applied to the motor generator MG1 from the outside into electric power.

The motor generator MG1, for example, is a synchronous machine or an induction machine, and, as described above, may be operated as an electrical motor or a power generator in accordance with an operating mode. In a case where the motor generator MG1 is mounted in a vehicle, the motor generator has preferably a small size and a high output, and a synchronous electrical motor of a permanent magnet type using a magnet such as a neodymium is appropriate as the motor generator. In addition, the synchronous electrical motor of a permanent magnet type has heat generation of a rotor lower than that of an induction electrical motor and is superior for a vehicle from that viewpoint as well.

The output torque of the output side of the engine EGN is transferred to the motor generator MG1 through a power transfer TSM, and the rotational torque transferred from the power transfer TSM or the rotational torque generated by the motor generator MG1 is transferred to wheels through a transmission TM and a differential gear DEF. Meanwhile, at the time of operating of regenerative braking, the rotational torque is transferred to the motor generator MG1 from the wheels, and AC power is generated based on the supplied rotational torque. The generated AC power is converted into DC power by a power inverter 200, as will be described later, and charges a high-voltage battery 136, and the charged electric power is used as driving energy again.

Next, the power inverter 200 will be described. An inverter circuit 140 is electrically connected to a battery 136 through a DC-side connector 138, and the battery 136 and the inverter circuit 140 perform power transmission/reception therebetween. In a case where the motor generator MG1 is operated as an electrical motor, the inverter circuit 140 generates AC power based on DC power supplied from the battery 136 through a DC-side connector 138 and supplies the generated AC power to the motor generator MG1 through an AC connector 188. A configuration formed by the motor generator MG1 and the inverter circuit 140 operates as a first motor generator unit.

In this embodiment, by operating the first motor generator unit as an electrical motor unit using electric power of the battery 136, the vehicle can be driven only using the power of the motor generator MG1. In addition, in this embodiment, by operating the first motor generator unit as a power generation unit using the power of the engine EGN or the power transferred from the wheels so as to generate power, the battery 136 can be charged.

In addition, the power inverter 200 includes a capacitor module 500 used for smoothing DC power supplied to the inverter circuit 140.

The power inverter 200 includes a connector 21 for communication that is used for receiving an instruction from a control device of an upper level or transmitting data representing a state to the control device of the upper level. The power inverter 200 calculates the control amount of the motor generator MG1 using the control circuit 172 based on an instruction input from the connector 21, further calculates whether to operate as an electrical motor or a power generator, generates a control pulse based on a result of the calculation, and supplies the control pulse to a driver circuit 174. The driver circuit 174 generates a drive pulse used for controlling the inverter circuit 140 based on the supplied control pulse.

Figure 2:
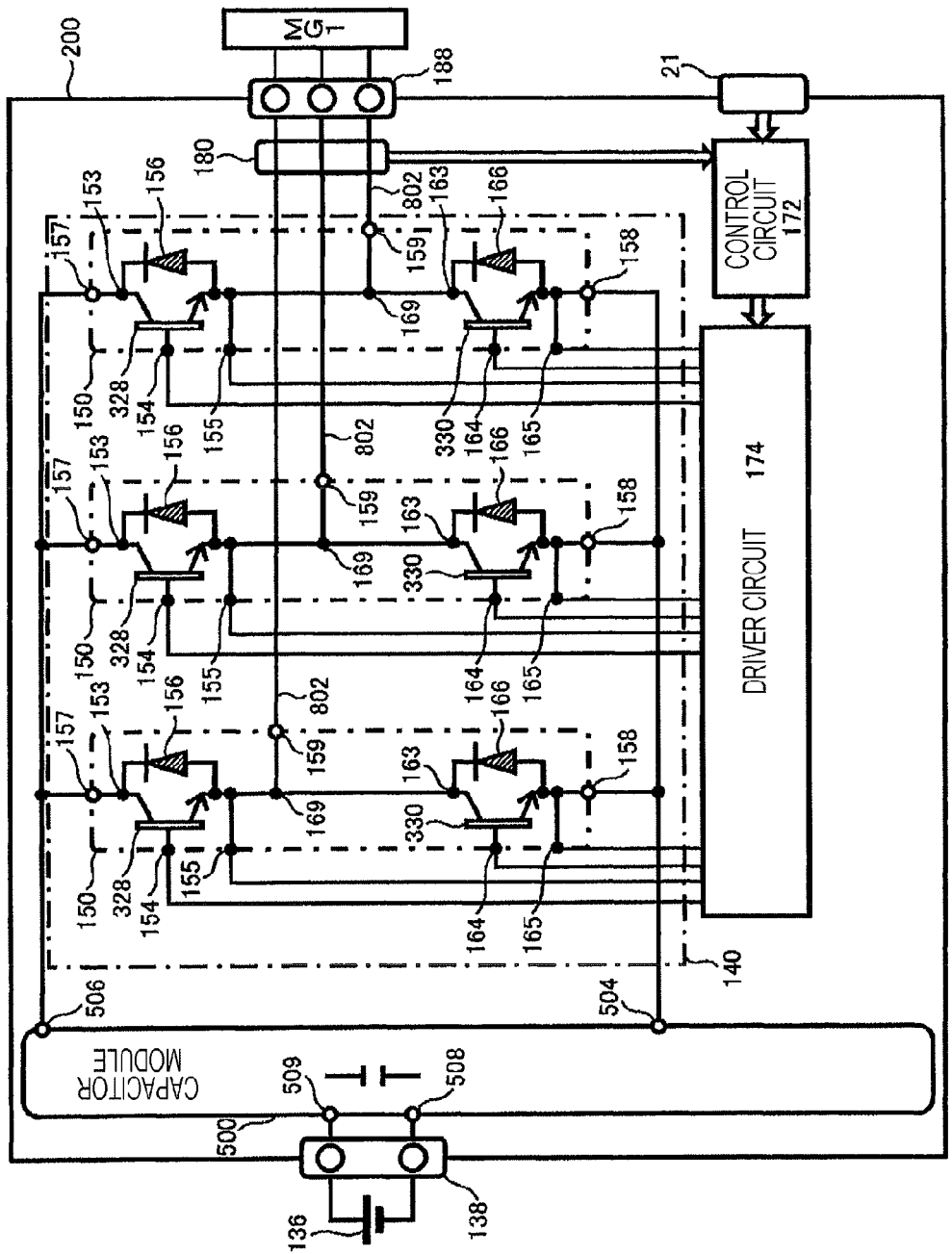
FIG. 2 is a circuit diagram that illustrates the configuration of an electrical circuit illustrated in FIG. 1.

Next, the configuration of an electrical circuit of the inverter circuit 140 will be described with reference to FIG. 2. Hereinafter, an insulated gate bipolar transistor is used as a semiconductor device and will be abbreviated as an IGBT. A series circuit 150 of upper and lower arms is configured by an IGBT 328 and a diode 156 that operate as an upper arm and an IGBT 330 and a diode 166 that operate as a lower arm. The inverter circuit 140 includes the series circuits 150 in correspondence with three phases of a U phase, a V phase, and a W phase of AC power to be output.

In this embodiment, these three phases correspond to winding wires of three phases of armature windings of the motor generator MG1. The series circuit 150 of the upper and lower arms of each one of the three phases outputs an AC current from a neutral point 169 that is a middle point portion of the series circuit. This neutral point 169 is connected to AC busbars 802 and 804, to be described below, that are AC power lines to the motor generator MG1 through the AC terminals 159 and 188.

A collector 153 of the IGBT 328 of the upper arm is electrically connected to a positive-side capacitor terminal 506 of the capacitor module 500 through a positive terminal 157. In addition, an emitter of the IGBT 330 of the lower arm is electrically connected to a negative-side capacitor terminal 504 of the capacitor module 500 through a negative terminal 158.

As described above, the control circuit 172 receives a control instruction from the control device of the upper level through the connector 21, generates control pulses that are control signals used for controlling the IGBT 328 and the IGBT 330 configuring the upper arm or the lower arm of the series circuit 150 of each phase configuring the inverter circuit 140 based on this control instruction, and supplies the generated control pulses to the driver circuit 174.

The driver circuit 174 supplies drive pulses used for controlling the IGBT 328 and the IGBT 330 configuring the upper arm or the lower arm of the series circuit 150 of each phase to the IGBT 328 and the IGBT 330 of each phase based on the control pulses. The IGBT 328 and the IGBT 330 perform a conduction or cut-off operation based on the drive pulses supplied from the driver circuit 174 and converts DC power supplied from the battery 136 into three-phase AC power, and the converted power is supplied to the motor generator MG1.

The IGBT 328 includes the collector 153, the emitter 155 used for a signal, and a gate terminal 154. In addition, the IGBT 330 includes the collector 163, the emitter 165 used for a signal, and a gate 164. The diode 156 is electrically connected between the collector 153 and the emitter 155. In addition, the diode 166 is electrically connected between the collector 163 and the emitter 165.

As a switching power semiconductor device, a metal oxide semiconductor field effect transistor (hereinafter, abbreviated as an MOSFET) may be used, and, in such a case, the diodes 156 and 166 are unnecessary. As the switching power semiconductor device, the IGBT is appropriate in a case where a DC voltage is relatively high, and the MOSFET is appropriate in a case where a DC voltage is relatively low.

The capacitor module 500 includes a positive-side capacitor terminal 506, a negative-side capacitor terminal 504, a positive-side power source terminal 509, and a negative-side power source terminal 508. High-voltage DC power supplied from the battery 136 is supplied to the positive-side power source terminal 509 and the negative-side power source terminal 508 through the DC-side connector 138 and is supplied from the positive-side capacitor terminal 506 and the negative-side capacitor terminal 504 of the capacitor module 500 to the inverter circuit 140.

Meanwhile, the DC power converted from the AC power by the inverter circuit 140 is supplied from the positive-side capacitor terminal 506 and the negative-side capacitor terminal 504 to the capacitor module 500, is supplied from the positive-side power source terminal 509 and the negative-side power source terminal 508 to the battery 136 through the DC-side connector 138, and is accumulated in the battery 136.

The control circuit 172 includes a microcomputer (hereinafter, referred to as a "microcomputer") used for performing a calculation process of switching timings of the IGBT 328 and the IGBT 330. As input information input to the microcomputer, there are a target torque value required for the motor generator MG1, a current value supplied from the series circuit 150 to the motor generator MG1, and a magnetic pole position of the rotor of the motor generator MG1.

The target torque value is based on an instruction signal output from the control device of the higher level that is not illustrated in the figure. The current value is detected based on a detection signal detected by the current sensor 180. The magnetic pole position is detected based on a detection signal output from a rotational magnetic pole sensor (not illustrated in the figure) such as a resolver disposed in the motor generator MG1. In this embodiment, while a case has been described in which the current sensor 180 detects a three-phase current value, a current value corresponding to 2 phases may be detected, and the three-phase current may be acquired through a calculation.

The microcomputer disposed inside the control circuit 172 calculates current instruction values of the d axis and the q axis of the motor generator MG1 based on the target torque value, calculates voltage instruction values of the d axis and the q axis based on the calculated current instruction values of the d axis and the q axis and difference values from the detected current values of the d axis and the q axis, and converts the calculated voltage instruction values of the d axis and the q axis into voltage instruction values of the U phase, the V phase, and the W phase based on the detected magnetic pole position. Then, the microcomputer generates a pulse-shaped modulated wave based on a comparison between a fundamental wave (sinusoidal wave) and a carrier wave (triangular wave) that are based on the voltage instruction values of the U phase, the V phase, and the W phase, and outputs the generated modulated wave to the driver circuit 174 as a PWM (pulse width modulation) signal.

In a case where the lower arm is driven, the driver circuit 174 outputs a drive signal acquired by amplifying the PWM signal to the gate of the IGBT 330 of the corresponding lower arm. On the other hand, in a case where the upper arm is driven, the driver circuit 174 shifts the level of the reference electric potential of the PWM signal to the level of the reference electric potential of the upper arm, then amplifies the PWM signal, and outputs a resultant signal to the gate of the IGBT 328 of the corresponding upper arm as a drive signal.

In addition, the microcomputer disposed inside the control circuit 172 performs detection of an abnormality (an overcurrent, an overvoltage, an excess temperature or the like), thereby protecting the series circuit 150. Accordingly, sensing information is input to the control circuit 172. For example, from emitters 155 and 165 of each arm that are used for signals, information of currents flowing through the emitters of the IGBT 328 and the IGBT 330 is input to a corresponding driving unit (IC). From this, each driving unit (IC) detects an overcurrent and protects the IGBT 328 and the IGBT 330 corresponding thereto from the overcurrent by stopping the switching operations of the IGBT 328 and the IGBT 330 corresponding thereto in a case where an overcurrent is detected.

From a temperature sensor (not illustrated) disposed in the series circuit 150, the information of the temperature of the series circuit 150 is input to the microcomputer. In addition, the information of the DC positive-side voltage of the series circuit 150 is input to the microcomputer. The microcomputer performs excess temperature detection and overvoltage detection based on such information and stops the switching operations of all the IGBTs 328 and 330 in a case where an excess temperature or an overvoltage is detected.

Figure 3:
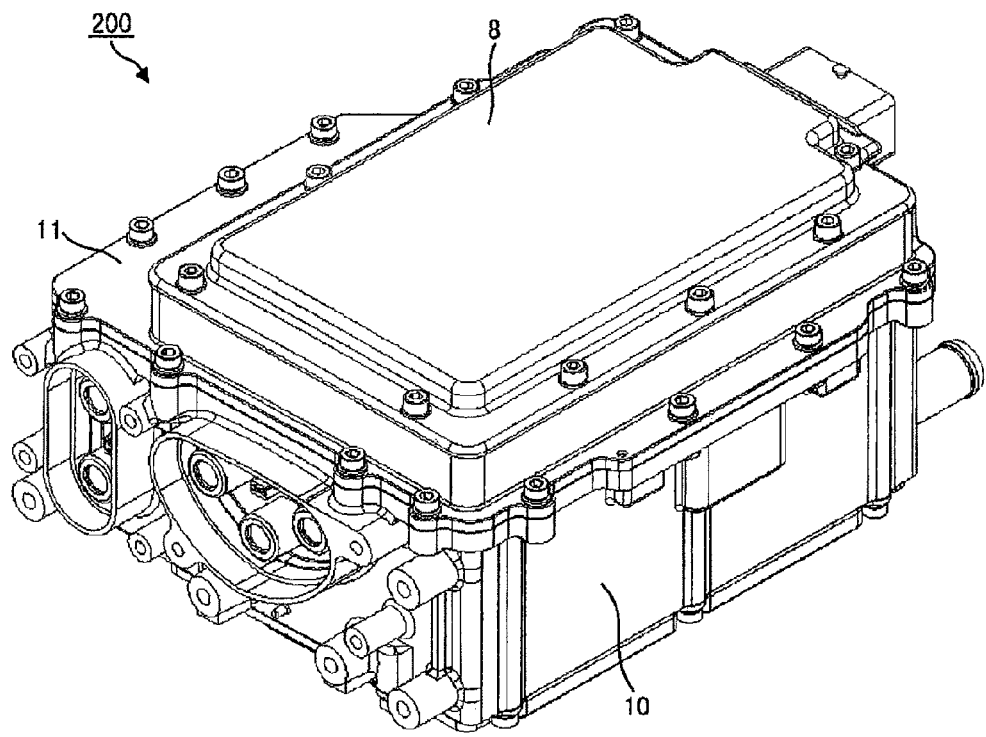
FIG. 3 is a perspective view that illustrates the outer appearance of a power inverter 200.
Figure 4:
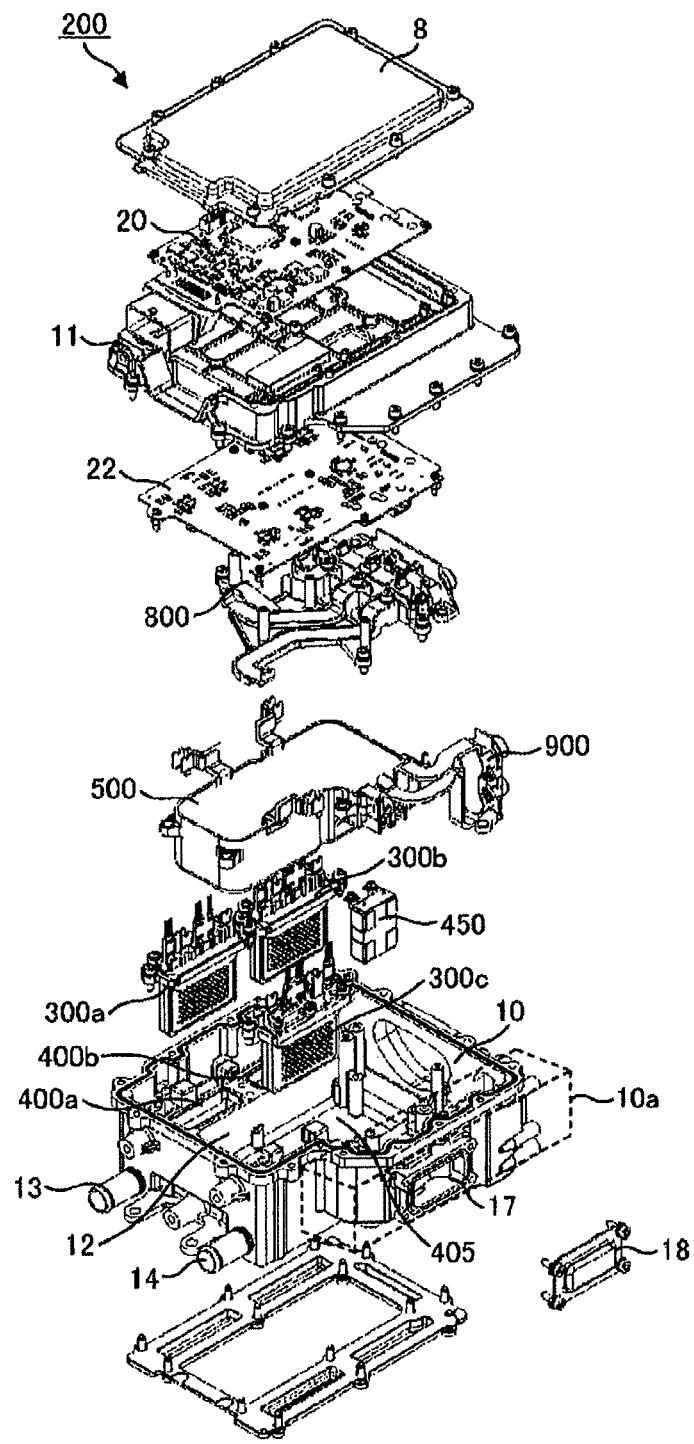
FIG. 4 is an exploded perspective view of the power inverter 200.

FIG. 3 is a perspective view that illustrates the outer appearance of the power inverter 200. FIG. 4 is an exploded perspective view of the power inverter 200 for illustrating the internal configuration of a casing 10 of the power inverter 200.

An inlet pipe 13 used for introducing coolant and an outlet pipe 14 used for allowing the coolant to flow out are arranged on the same side face of the casing 10. The casing 10 houses the cooling block 12 such that a coolant path 19 illustrated in FIG. 5 runs along both sides of the casing 10. In an upper face of one side of the cooling block 12, opening portions 400*a* and 400*b* are formed along the side face of the casing 10, and, in an upper face of the other side of the cooling block 12, an opening portion 400*c* is formed. The opening portions 400*a* to 400*c* are closed by inserted power semiconductor modules 300*a* to 300*c*.

Figure 5:
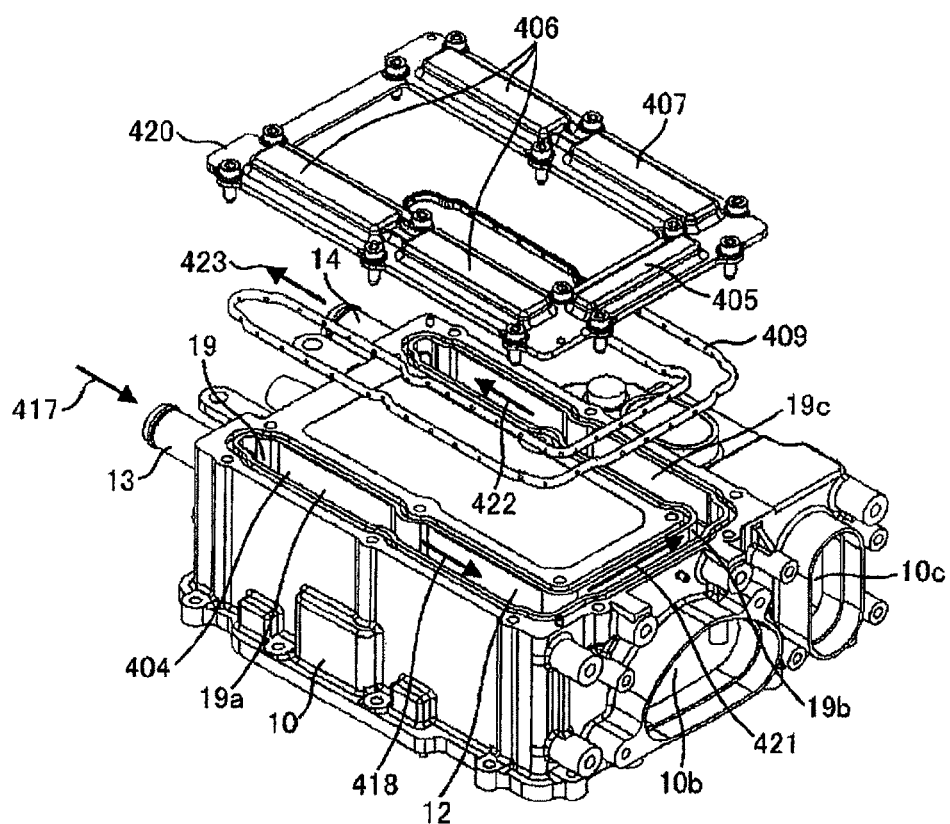
FIG. 5 is a diagram of a casing 10, which is illustrated in FIG. 4, viewed from the lower side.

Between one flow path and the other flow path in which the cooling block 12 is formed, a housing space 405 used for housing the capacitor module 500 is formed, and the capacitor module 500 is housed in the housing space 405. From this, the capacitor module 500 is cooled by the coolant flowing inside the coolant path 19. Since the capacitor module 500, as illustrated in FIG. 5, is arranged so as to be surrounded by the flow paths 19*a* to 19*c*, the capacitor module 500 can be cooled with high efficiency.

As above, since the flow path is formed along the outer face of the capacitor module 500, the flow path, the capacitor module 500, and the power semiconductor module 300 are orderly arranged, thereby decreasing in size as a whole. In addition, since the flow paths 19*a* and 19*c* are arranged along the longer side of the capacitor module 500, distances between the power semiconductor modules 300 and 301 that are inserted to be fixed to the coolant path 19 and the capacitor module 500 are approximately constant, and accordingly, the circuit constant of the smoothing capacitor and the power semiconductor module circuit can be easily balanced for each layer of three phases, whereby a circuit configuration that can easily decrease a spike voltage is formed. In this embodiment, water is the most appropriate as a coolant. However, a coolant other than water can be used and, hereinafter, will be referred to as a coolant.

On the upper side of the capacitor module 500, the bulbar assembly 800 to be described later is arranged. The busbar assembly 800 includes an AC busbar 186 and a holder and holds the current sensor 180. Details thereof will be described later.

By forming the main structure of the coolant path 19 to be integrated with the cooling block 12 using a casting made of aluminum, the coolant path 19 has an effect of improving the mechanical strength in addition to the cooling effect. In addition, by forming the coolant path 19 through aluminum casting, the cooling block 12 and the coolant path 19 have an integrated structure, and accordingly the heat conduction is improved, whereby the cooling efficiency is improved. Furthermore, by integrally forming the cooling block 12 and the casing 10 using a casting made of aluminum, the coolant path 19 has an effect of further improving the mechanical strength in addition to the cooling effect. In addition, by integrally forming the cooling block 12 and the casing 10 through casting, the heat conduction of the whole power inverter 200 is improved, whereby the cooling efficiency is improved.

The driver circuit board 22 is arranged on the upper side of the busbar assembly 800. In addition, between the driver circuit board 22 and the control circuit board 20, a metal base plate 11 is arranged.

The metal base plate 11 is fixed to the casing 10. The metal base plate 11 has a function for electronically shielding a circuit group mounted on the driver circuit board 22 and the control circuit board 20 and an action of cooling by getting rid of the heat generated by the driver circuit board 22 and the control circuit board 20. The metal base plate 11 has a high noise suppressing function, which will be described later.

In addition, there is an action of increasing the mechanical resonance frequency of the control circuit board 20. In other words, screw fixing portions used for fixing the control circuit board 20 to the metal base plate 11 can be arranged at a short interval, and a distance between support points in a case where a mechanical vibration occurs can be shortened, whereby the resonance frequency can be increased. Since the resonance frequency of the control circuit board 20 can be high with respect to the vibration frequency transferred from the engine or the like, the influence of the vibration is not easily received, and the reliability is improved.

A cover 8 is fixed to the metal base plate 11 and protects the control circuit board 20 from an electromagnetic noise transmitted from the outside.

In the casing 10 according to this embodiment, a portion in which the cooling block 12 is housed has the shape of an approximate rectangular parallelepiped, and a protruded housing portion 10*a* is formed from one side face side of the casing 10. In the protruded housing portion 10*a*, a terminal prolonged from the DCDC converter, a DC-side busbar assembly 900 to be described below, and a resistor 450 are housed. Here, the resistor 450 is a resistor that is used for discharging electric charge accumulated in the capacitor element of the capacitor module 500. As above, since electric circuit components between the battery 136 and the capacitor module 500 are integrated in the protruded housing portion 10*a*, the complication of wiring can be suppressed, whereby the size of the whole device can be decreased.

The cover 18 is a member that is used for closing an operating window 17 used for a connection with a terminal prolonged from the DCDC converter.

As above, the power inverter 200 is configured such that the cooling block 12 is arranged at the bottom of the power inverter 200, and next, an operation of fixing necessary components such as the capacitor module 500, the busbar assembly 800, and the board is performed sequentially from the top, whereby the productivity and the reliability are improved.

FIG. 5 is a diagram that illustrates the casing 10 and the cooling block 12 and is a diagram of the casing 10, which is illustrated in FIG. 4, viewed from the lower side.

In the lower face of the casing 10, an opening portion 404 connected as one is formed, and the opening portion 404 is closed by a cover 420 having an opening in the center portion. Between the lower cover 420 and the casing 10, a sealing member 409 is disposed and maintains airtightness.

In the lower cover 420, convex portions 406 protruding toward a side opposite to a side on which the coolant path 19 is arranged are formed. The convex portions 406 are disposed in correspondence with the power semiconductor modules 300a to 300c. A convex portion 407 is not in correspondence with the power semiconductor modules but is disposed so as to adjust the cross-sectional area of the coolant path 19.

The coolant passes the inlet pipe 13 in a flow direction 417 denoted by a dotted line and flows inside the first flow path portion 19a formed along a side of the casing 10, which is disposed in the longitudinal direction, in a flow direction 418. In addition, the coolant, in a flow direction 421, flows through the second flow path portion 19b formed along a side of the casing 10, which is disposed in the widthwise direction, in the flow direction 421. The second flow path portion 19b repeatedly forms a flow path. In addition, the coolant flows through the third flow path portion 19c formed along a side of the cooling block 12, which is formed in the longitudinal direction, in a flow direction 422. The third flow path portion 19c is disposed at a position facing the first flow path portion 19a through the capacitor module 500. In addition, the coolant passes through and flows out from the outlet pipe 14 in a flow direction 423.

All the first, second, and third flow path portions 19a, 19b, and 19c are formed such that the size in the depth direction is larger than the size in the widthwise direction. In addition, since the opening portion 404 is formed on the rear face of the casing 10 and the opening portions 400a to 400c are formed to face each other, the cooling block 12 has a configuration that can be easily manufactured through aluminum casting.

The detailed configuration of the power semiconductor modules 300a to 300c used in the inverter circuit 140 will be described with reference to FIGS. 6 to 10. All the structures of the power semiconductor modules 300a to 300c have the same structure, and the structure of the power semiconductor module 300a will be representatively described. In FIGS. 6 to 10, a signal terminal 325U corresponds to the gate terminal 154 and the emitter 155 for a signal illustrated in FIG. 2, and a signal terminal 325L corresponds to the gate 164 and the emitter 165 illustrated in FIG. 2. A DC positive terminal 315B is the same as the positive terminal 157 illustrated in FIG. 2, and a DC negative terminal 319B is the same as the negative terminal 158 illustrated in FIG. 2. In addition, an AC terminal 320B is the same as the AC terminal 159 illustrated in FIG. 2.

FIG. 6(a) is a perspective view of the power semiconductor module 300a according to this embodiment. FIG. 6(b) is a cross-sectional view of the power semiconductor module 300a according to this embodiment, which is cut in cross-section D and viewed in direction E.

Figure 6:
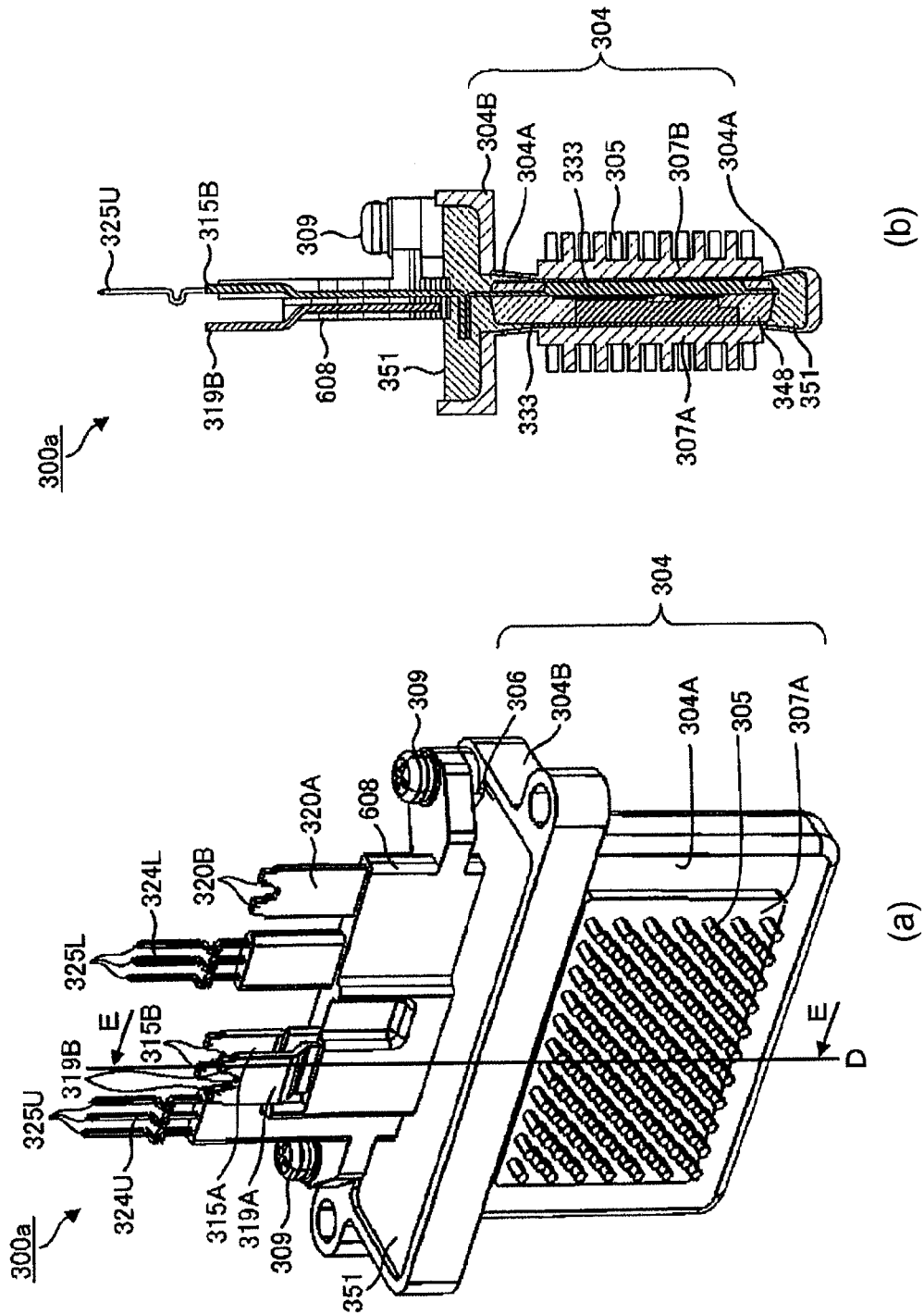
FIG. 6(a) is a perspective view of a power semiconductor module 300a according to this embodiment.
FIG. 6(b) is a cross-sectional view of the power semiconductor module 300a according to this embodiment, which is cut in cross-section D and viewed in direction E.
Figure 7:
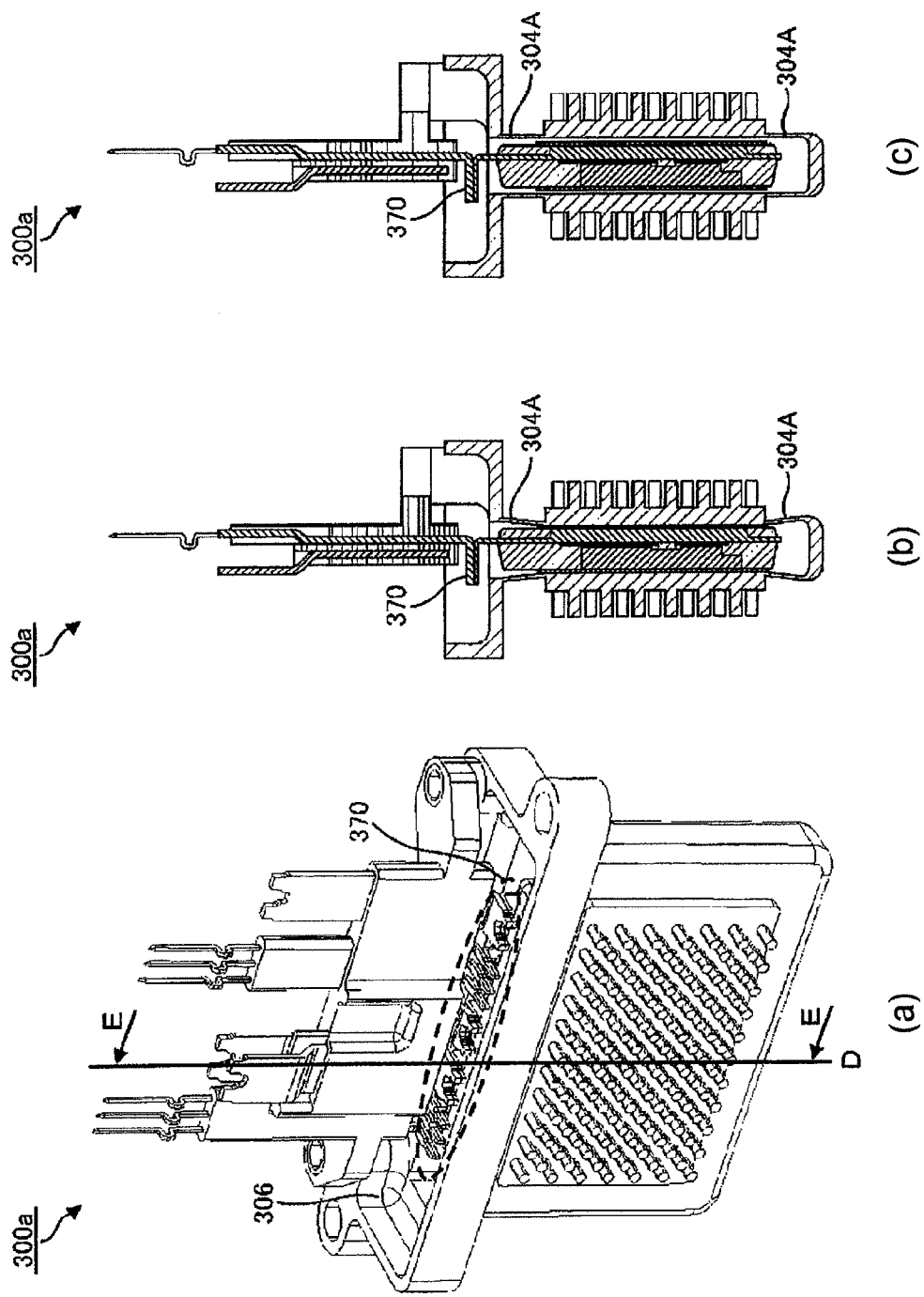
FIG. 7 is a diagram that illustrates the power semiconductor module 300a acquired by eliminating screws 309 and a second potting resin 351 from the state illustrated in FIG. 6.

FIG. 7 is a diagram that illustrates the power semiconductor module 300a acquired by eliminating screws 309 and a second potting resin 351 from the state illustrated in FIG. 6 for further understanding. FIG. 7(a) is a perspective view, and FIG. 7(b) is a cross-sectional view, similarly to FIG. 6(b), acquired when the power semiconductor module is cut in cross-section D and viewed in direction E. In addition, FIG. 7(c) illustrates a cross-sectional view before a fin 305 is pressed to deform a bending portion 304A.

Figure 8:
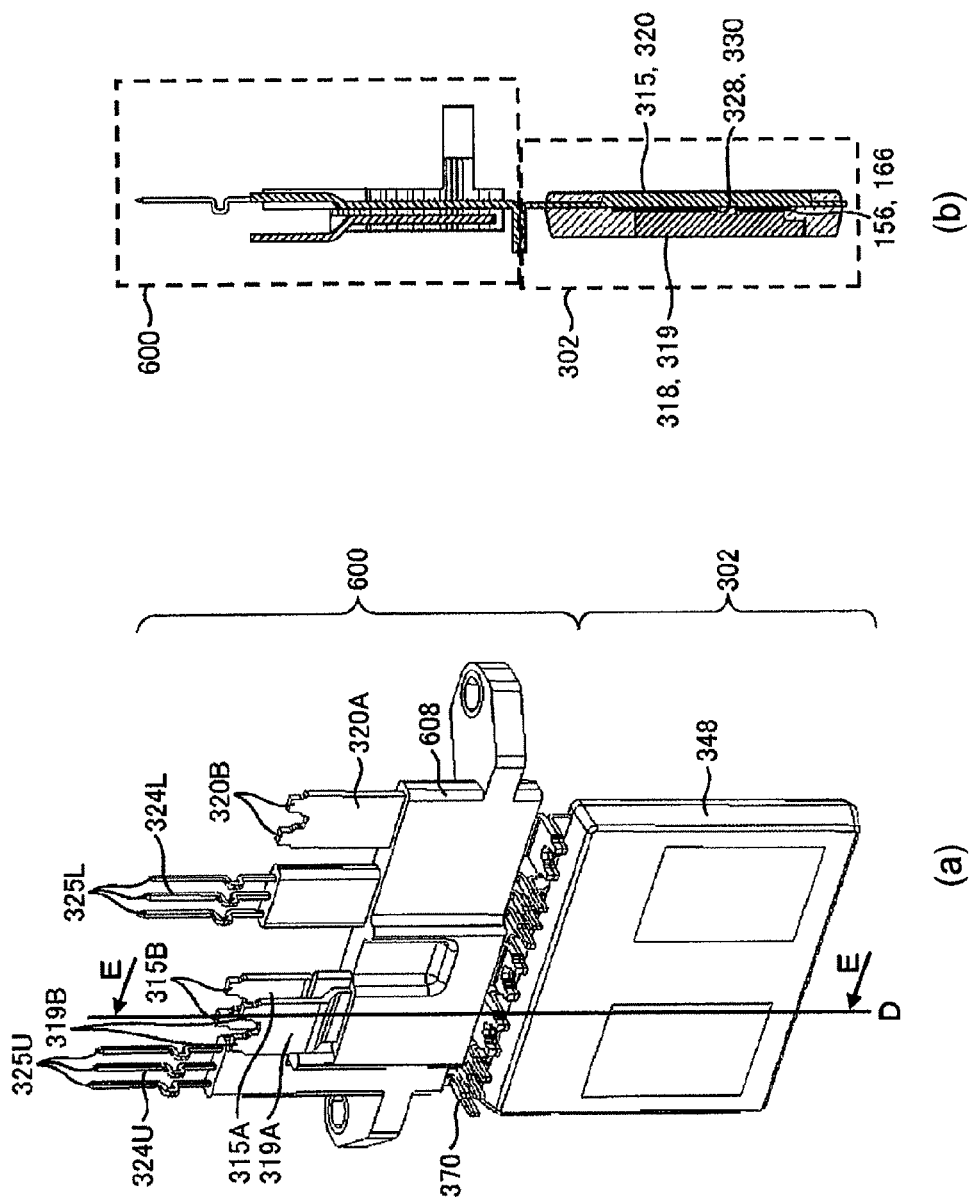
FIG. 8 is a diagram that illustrates the power semiconductor module 300a acquired by further eliminating a module casing 304 from the state illustrated in FIG. 7.

FIG. 8 is a diagram that illustrates the power semiconductor module 300a acquired by further eliminating a module casing 304 from the state illustrated in FIG. 7. FIG. 8(a) is a perspective view, and FIG. 8(b) is a cross-sectional view, similarly to FIGS. 6(b) and 7(b), acquired when the power semiconductor module is cut in cross-section D and viewed in direction E.

Figure 9:
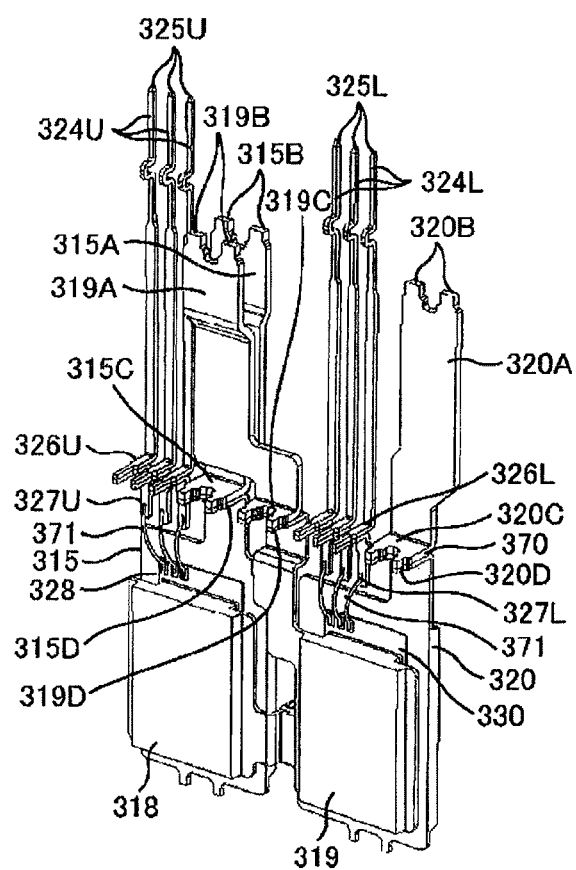
FIG. 9 is a perspective view of the power semiconductor module 300a acquired by further eliminating a first potting resin 348 and a wiring insulating portion 608 from the state illustrated in FIG. 8.

FIG. 9 is a perspective view of the power semiconductor module 300a acquired by further eliminating a first potting resin 348 and a wiring insulating portion 608 from the state illustrated in FIG. 8.

Figure 10:
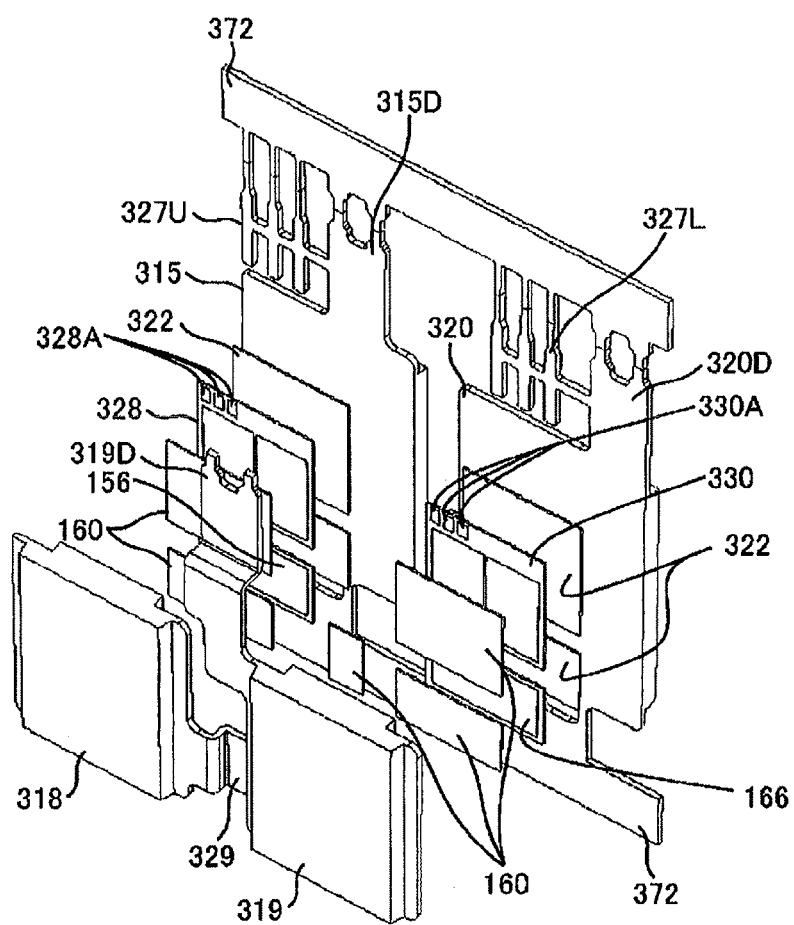
FIG. 10 is a diagram that illustrates an assembly process of a module primary potting body 302.

FIG. 10 is a diagram that illustrates an assembly process of a module primary potting body 302.

The power semiconductor devices (the IGBT 328, the IGBT 330 and the diodes 156 and 166) configuring the series circuit 150 of the upper and lower arms, as illustrated in FIGS. 8 and 9, are sandwiched by conductive plates 315 and 318, or conductive plates 320 and 319 from both sides and are fixed thereto. The conductive plate 315 and the like are sealed by the first potting resin 348 in a state in which a heat dissipating face thereof is exposed, and an insulation sheet 333 is thermally compressed and bonded to the heat dissipating face. The first potting resin 348, as illustrated in FIG. 8, has a polyhedron shape (here, an approximate rectangular parallelepiped shape).

The module primary potting body 302 sealed by the first potting resin 348 is inserted into the inside of the module casing 304 and is thermally compressed to the inner face of the module casing 304, which is a can-type cooler, through the insulation sheet 333. Here, the can-type cooler is a can-shaped cooler having an insertion opening 306 on one face and a bottom on the other face. In a space remaining inside the module casing 304, a second potting resin 351 is filled.

The module casing 304 is configured by a member having electrical conductivity, for example, an aluminum alloy material (Al, AlSi, AlSiC, Al—C, or the like) and is integrally molded in the state of having no joint. The module casing 304 has a structure having no opening other than the insertion opening 306, and the outer circumference of the insertion opening 306 is surrounded by a flange 304B. In addition, as illustrated in FIG. 6(a), a first heat dissipating face 307A and a second heat dissipating face 307B having faces broader than those of the other faces are arranged in the state facing each other, and the power semiconductor devices (the IGBT 328, the IGBT 330, and the diodes 156 and 166) are arranged to face such heat dissipating faces. Three faces connected to the first and second heat dissipating faces 307A and 307B configure faces sealed in a width narrower than those of the first and second heat dissipating faces 307A and 307B, and the insertion opening 306 is formed in a face of the remaining one side. The shape of the module casing 304 does not need to be a precise rectangular parallelepiped, and the corners thereof may form curved faces as illustrated in FIG. 6(a).

By using the metal casing having such a shape, even in a case where the module casing 304 is inserted into the inside of the coolant path 19 in which a coolant such as water or oil flows, the sealing of the coolant can be secured by the flange 304B, and accordingly, the cooling medium can be prevented from penetrating into the inside of the module casing 304 by employing a simple configuration. In addition, in the first and second heat dissipating faces 307A and 307B facing each other, fins 305 are uniformly formed. Furthermore, on the outer periphery of the first and second heat dissipating faces 307A and 307B, a bending portion 304A of which the thickness is extremely thin is formed. Since the bending portion 304A is formed to be extremely thin to a degree for which the bending portion is simply deformed by pressing the fins 305, the productivity after the insertion of the module primary potting body 302 is improved.

As described above, by thermally compressing and bonding the conductive plate 315 and the like to the inner wall of the module casing 304 through the insulation sheet 333, a gap between the conductive plate 315 and the like and the inner wall of the module casing 304 can decrease, whereby the heat generated in the power semiconductor devices can be transferred to the fins 305 with high efficiency. In addition, by implementing the thickness and the flexibility to the degrees of those of the insulation sheet 333, the generated thermal stress can be absorbed by the insulation sheet 333, and accordingly, the semiconductor module can be used in a power inverter for a vehicle of which a temperature change is intense.

Outside the module casing 304, a DC positive wiring 315A and a DC negative wiring 319A, which are made from metal, used for being electrically connected to the capacitor module 500 are disposed, and, in the distal end portions thereof, a DC positive terminal 315B (157) and a DC negative terminal 319B (158) are formed. In addition, a metal AC wiring 320A used for supplying AC power to the motor generator MG1 or MG2 is disposed, and, in the distal end, an AC terminal 320B (159) is formed. In this embodiment, as illustrated in FIG. 9, the DC positive wiring 315A is connected to the conductive plate 315, the DC negative wiring 319A is connected to the conductive plate 319, and the AC wiring 320A is connected to the conductive plate 320.

In addition, outside the module casing 304, signal wirings 324U and 324L, which are made of metal, used for being electrically connected to the driver circuit 174 are disposed, and, in the distal end portion thereof, signal terminals 325U (154, 155) and 325L (164 and 165) are formed. In this embodiment, as illustrated in FIG. 9, the signal wiring 324U is connected to the IGBT 328, and the signal wiring 324L is connected to the IGBT 328.

The DC positive wiring 315A, the DC negative wiring 319A, the AC wiring 320A, and the signal wirings 324U and 324L are integrally molded as an auxiliary module 600 in the state of being insulated from each other by the wiring insulating portion 608 molded using a resin material. The wiring insulating portion 608 also acts as a support member used for supporting each wiring, and a resin material used therefor is preferably a thermosetting resin or a thermoplastic resin having an insulating property. From this, the insulating property between the DC positive wiring 315A, the DC negative wiring 319A, the AC wiring 320A, and the signal wirings 324U and 324L can be secured, whereby high-density wiring can be performed.

After being metallic bonded to the module primary potting body 302 at a connection portion 370, the auxiliary module 600 is fixed to the module casing 304 using a screw 309 passing through a screw hole arranged in the wiring insulating portion 608. For the metallic bonding between the module primary potting body 302 and the auxiliary module 600 at the connection portion 370, for example, TIG welding or the like can be used.

The DC positive wiring 315A and the DC negative wiring 319A are stacked together in the state of facing each other with the wiring insulating portion 608 interposed therebetween and forms a shape extending in parallel with each other. By employing such an arrangement and the shape, current that instantly flows at the time of a switching operation of the power semiconductor devices face each other and flow in opposite directions. From this, magnetic fields generated by the currents act to be offset with each other, and implementation of low inductance can be performed based on this action. Here, the AC wiring 320A and the signal terminals 325U and 325L extend in the same direction as that of the DC positive wiring 315A and the DC negative wiring 319A.

The connection portion 370 in which the module primary potting body 302 and the auxiliary module 600 are connected through metallic bonding is sealed inside the module casing 304 by the second potting resin 351. From this, a necessary insulation distance between the connection portion 370 and the module casing 304 can be secured in a stable manner, and the size of the power semiconductor module 300a can be implemented to be smaller than that of a case where sealing is not performed.

As illustrated in FIG. 9, on the auxiliary module 600 side of the connection portion 370, an auxiliary module-side DC positive connection terminal 315C, an auxiliary module-side DC negative connection terminal 319C, an auxiliary module-side AC connection terminal 320C, an auxiliary module-side signal connection terminal 326U, and an auxiliary module-side signal connection terminal 326L are arranged to as to be aligned in one row. On the other hand, on the module primary potting body 302 side of the connection portion 370, along one face of the first potting resin 348 having a polyhedron shape, a device-side DC positive connection terminal 315D, a device-side DC negative connection terminal 319D, device-side AC connection terminal 320D, a device-side signal connection terminal 327U, and a device-side signal connection terminal 327L are arranged so as to be aligned in one row. As above, by employing the configuration in which the terminals are aligned in one row in the connection portion 370, the module primary potting body 302 can be easily manufactured by transfer mold.

Here, the positional relations between the terminals when a portion extending from the first potting resin 348 of the module primary potting body 302 to the outer side is viewed as one terminal for each type will be described. In description presented below, a terminal that is configured by the DC positive wiring 315A (including the DC positive terminal 315B and the auxiliary module-side DC positive connection terminal 315C) and the device-side DC positive connection terminal 315D will be referred to as a positive-side terminal, a terminal that is configured by the DC negative wiring 319A (including the DC negative terminal 319B and the auxiliary module-side DC negative connection terminal 319C) and the device-side DC negative connection terminal 315D will be referred to as a negative-side terminal, a terminal that is configured by the AC wiring 320A (including the AC terminal 320B and the auxiliary module-side AC connection terminal 320C) and the device-side AC connection terminal 320D will be referred to as an output terminal, a terminal that is configured by the signal wiring 324U (including the signal terminal 325U and the auxiliary module-side signal connection terminal 326U) and the device-side signal connection terminal 327U will be referred to as an upper arm signal terminal, and a terminal that is configured by the signal wiring 324L (including the signal terminal 325L and the auxiliary module-side signal connection terminal 326L) and the device-side signal connection terminal 327L will be referred to as a lower arm signal terminal.

Each terminal described above protrudes from the first potting resin 348 and the second potting resin 351 through the connection portion 370, and the protruded portions (the device-side DC positive connection terminal 315D, the device-side DC negative connection terminal 319D, the device-side AC connection terminal 320D, the device-side signal connection terminal 327U, and the device-side signal connection terminal 327L) protruded from the first potting resin 348 are aligned in one row along one face of the first potting resin 348 having a polyhedron shape as described above. In addition, the positive-side terminal and the negative-side terminal protrude from the second potting resin 351 in a stacked state and extend to the outside of the module casing 304. By employing such a configuration, at the time of mold closing when the module primary potting body 302 is manufactured by sealing the power semiconductor device using the first potting resin 348, excess stress applied to a connection portion between the power semiconductor device and the terminal and generation of a gap in the metal mold can be prevented. In addition, owing to the currents in opposite directions that flow through the positive-side terminal and the negative-side terminal that are stacked, magnetic fluxes are generated in directions for offsetting the magnetic fluxes with each other, and accordingly, implementation of low inductance can be achieved.

On the auxiliary module 600 side, the auxiliary module-side DC positive connection terminal 315C and the auxiliary module-side DC negative connection terminal 319C are formed in distal end portions of the DC positive wiring 315A and the DC negative wiring 319A on a side opposite to the DC positive terminal 315B and the DC negative terminal 319B. In addition, the auxiliary module-side AC connection terminal 320C is formed in a distal end portion of the AC wiring 320A that is located on a side opposite to the AC terminal 320B. The auxiliary module-side signal connection terminals 326U and 326L are formed in distal end portions of the signal wirings 324U and 324L which are located on a side opposite to the signal terminals 325U and 325L.

On the module primary potting body 302 side, the device-side DC positive connection terminal 315D, the device-side DC negative connection terminal 319D, and the device-side AC connection terminal 320D are formed on the conductive plates 315, 319, and 320. In addition, the device-side signal connection terminals 327U and 327L are connected to the IGBTs 328 and 330 by a bonding wire 371.

As illustrated in FIG. 10, the DC positive-side conductive plate 315, the AC output-side conductive plate 320, and the device-side signal connection terminals 327U and 327L are integrally processed so as to be arranged on an approximate same plane in the state of being connected to a common tie bar 372. The collector of the IGBT 328 on the upper arm side and the cathode of the diode 156 on the upper arm side are fixed to the conductive plate 315. The collector of the IGBT 330 on the lower arm side and the cathode of the diode 166 on the lower arm side are fixed to the conductive plate 320. On the IGBTs 328 and 330 and the diodes 156 and 166, the conductive plates 318 and 319 are arranged on an approximate same plane. The emitter of the IGBT 328 on the upper arm side and the anode of the diode 156 on the upper arm side are fixed to the conductive plate 318. The emitter of the IGBT 330 on the lower arm side and the anode of the diode 166 on the lower arm side are fixed to the conductive plate 319. Each power semiconductor device is fixed to a device fixation portion 322 disposed in each conductive plate through a metal bonded joint 160. The metal bonded joint 160 is, for example, a soldering member, a low-temperature sintering joint including a silver sheet and fine metal particles, or the like.

Each power semiconductor device has a plate-shaped flat structure, and the electrodes of the power semiconductor device are formed on the front and rear faces. As illustrated in FIG. 10, the electrodes of the power semiconductor devices are interposed by the conductive plates 315 and 318 or the conductive plates 320 and 319. In other words, the conductive plates 315 and 318 have a stacked arrangement facing each other through the IGBT 328 and the diode 156 so as to be approximately parallel to each other. Similarly, the conductive plates 320 and 319 have a stacked arrangement facing each other through the IGBT 330 and the diode 166 so as to be approximately parallel to each other. In addition, the conductive plates 320 and 318 are connected to each other through a neutral point 329. In accordance with this connection, the upper arm circuit and the lower arm circuit are electrically connected to each other, thereby forming a series circuit of the upper and lower arms. As described above, the IGBT 328 and the diode 156 are sandwiched between the conductive plates 315 and 318, the IGBT 330 and the diode 166 are sandwiched between the conductive plates 320 and 319, and the conductive plates 320 and 318 are connected through the neutral point 329. Thereafter, a control electrode 328A of the IGBT 328 and a device-side signal connection terminal 327U are connected using the bonding wire 371, and a control electrode 330A of the IGBT 330 and a device-side signal connection terminal 327L are connected using the bonding wire 371.

Figure 11:
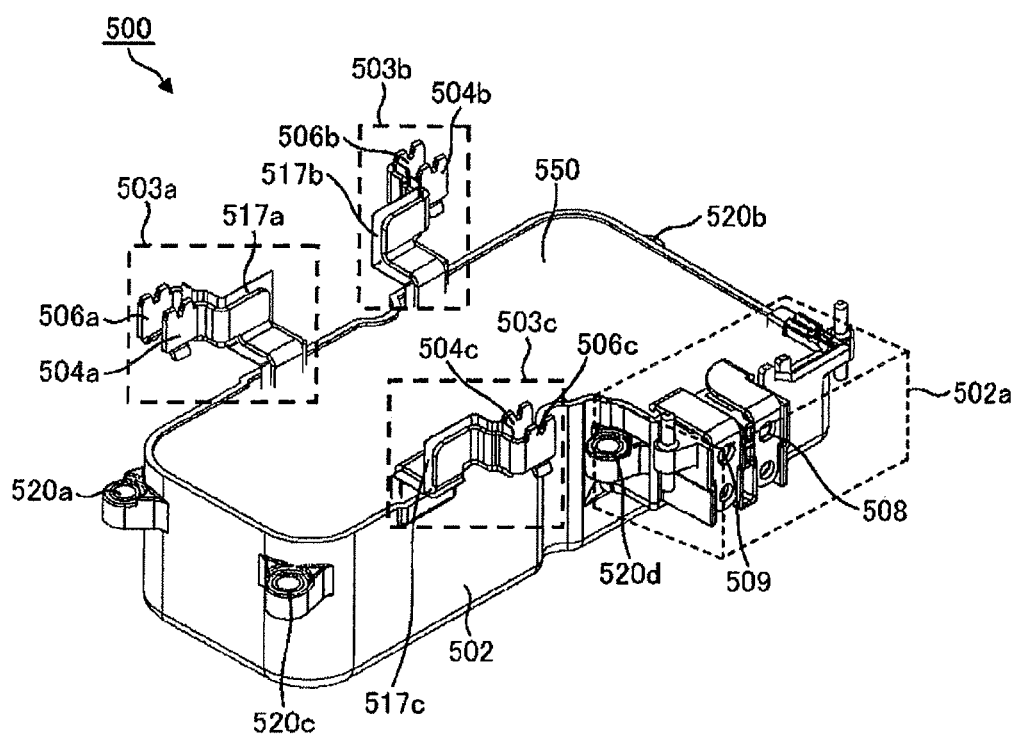
FIG. 11 is a perspective view that illustrates the structure of a capacitor module 500.

FIG. 11 is a perspective view illustrating the structure of the capacitor module 500. Although not illustrated in FIG. 11, inside the capacitor casing 502, a plurality of film capacitors are disposed, and the film capacitors are electrically connected to the negative conductive plate and the positive conductive plate. Between the negative conductive plate and the positive conductive plate, a member having an insulation property is arranged so as to lower the inductance, and the negative conductive plate and the positive conductive plate are configured in a stacked state. In other words, the negative conductive plate and the positive conductive plate configure a stacked conductive plate.

A resin potting material 550 is filled in the capacitor casing 502 so as to fix the film capacitors and the stacked conductive plates to the capacitor casing 502. The negative-side power source terminal 508 and the positive-side power source terminal 509 are electrically connected to the stacked conductive plates, protrude from an exposed face of the resin potting material 550, and are folded to the side face of the capacitor casing 502. DC power is supplied to the positive-side power source terminal 509 and the negative-side power source terminal 508 through the DC-side connector 138 as described with reference to FIG. 2.

The capacitor terminals 503a to 503c are electrically connected to the stacked conductive plates and are disposed in correspondence with the positive terminal 157 (315B) and the negative terminal 158 (319B) of the semiconductor module 300. The capacitor terminals 503a to 503c are connected to the power semiconductor modules 300a to 300c. Between the negative-side capacitor terminal 504a and the positive-side capacitor terminal 506a configuring the capacitor terminal 503a, an insulation sheet 517a is disposed, and the insulation property is secured. The other capacitors 503b and 503c are similarly configured.

In the capacitor casing 502, a fixation unit that is used for fixing the capacitor module 500 to the cooling block 12, for example, holes 520a to 520d used for passing screws is disposed.

In addition, on one side face, which is on the side of a longer side, of the capacitor casing 502, a protruded housing portion 502a is formed. Inside this protruded housing portion 502a, an electric circuit device that is electrically connected to the film capacitors and the power source terminals 508 and 509 in parallel or in series is housed. In this embodiment, a noise elimination capacitor that eliminates a noise transmitted from the battery 136 and is electrically connected to the ground is housed. Since this capacitor is smaller than the film capacitor, the protruded housing portion 502a is formed to have a height lower than that of the capacitor casing 502. In other words, a space is formed on the lower side of the protruded housing portion 502a. The cooling block 12 illustrated in FIG. 3 forms a part of the coolant path 19 in this space. From this, the noise elimination capacitor can be cooled, and a local increase in the cross-sectional area of the coolant path 19 is suppressed so as to prevent an increase in the pressure loss.

As illustrated in FIG. 3, the power semiconductor module 300c is fixed to the cooling block 12 so as to face the power semiconductor module 300a through the capacitor module 500, and the noise elimination capacitor is arranged at a position facing the power semiconductor module 300b through the capacitor module 500. From this, even in a case where an arrangement is employed in which two of the power semiconductor modules 300a to 300c disposed for each phase are arranged on one side face of the capacitor module 500, and one thereof is arranged on the other side face, the power semiconductor modules 300a to 300c and the capacitor module 500 are orderly configured, and the cooling capability of the coolant path 19 can be sufficiently drawn.

Furthermore, as described above, the power source terminals 508 and 509 protrude from the protruded housing portion 502a. Accordingly, the power source terminals 508 and 509 are arranged so as to be closer to the noise elimination capacitor than any one of the power semiconductor modules 300a to 300c, and the influence of the noise on the power semiconductor modules 300a to 300c is reduced.

FIG. 12(a) is a perspective view that illustrates the outer appearance of the power semiconductor modules 300a to 300c, the capacitor module 500, and a busbar assembly 800 imposed in the casing 10. FIG. 12(b) is an enlarged diagram of portion A illustrated in FIG. 12(a).

The DC positive terminal 315B (157), the DC negative terminal 319B (158), the AC terminal 321 (159), and a second potting unit 601B extend toward the cover 8 side in the vertical direction of the casing 10. The area of the current path of the DC positive terminal 315B (157) and the DC negative terminal 319B (158) is much smaller than the area of the current path of the stacked conductive plates disposed inside the capacitor module 500. Accordingly, when currents flow from the stacked conductive plates to the DC positive terminal 315B (157) and the DC negative terminal 319B (158), the area of the current path markedly changes. In other words, the current is concentrated in the DC positive terminal 315B (157) and the DC negative terminal 319B (158).

Thus, in this embodiment, the negative-side capacitor terminal 504a includes a rise portion 540 that rises from the stacked conductive plates, and a connection portion 542 is included in the distal end portion thereof. In addition, the positive-side capacitor terminal 506a includes a rise portion 543 that rises from the stacked conductive plates, and a connection portion 545 is included in the distal end portion thereof. Between the connection portions 542 and 545, the DC negative terminal 319B (158) or the DC positive terminal 315B (157) of the power semiconductor module 300a are connected to be sandwiched.

From this, since a stacked structure is formed in which the negative-side capacitor terminal 504a and the positive-side capacitor terminal 506a are through the insulation sheet right before the connection portions 542 and 545, and the inductance of a wiring portion of the capacitor terminal in which the current is concentrated can be reduced. In addition, the distal end of the DC negative terminal 319B (158) and the side face of the connection portion 542 are connected by welding, and, similarly, the distal end of the DC positive terminal 315B (157) and the side face of the connection portion 545 are connected by welding. Accordingly, in addition to the improvement of the characteristics through implementation of low inductance, the productivity can be improved.

The distal end of the AC terminal 321 (159) of the power semiconductor module 300a and the distal end of the AC busbar 802a are connected by welding. In production facilities for welding, a case where a welding machine is configured to be operable for a plurality of directions with respect to a welding target leads to complication of the production facilities, which is not desirable from the viewpoint of the productivity and the cost. Thus, in this embodiment, a welding portion of the AC terminal 321 (159) and the welding portion of the DC negative terminal 319B (158) are arranged on one straight line along a side of the casing 10 in the longitudinal direction. From this, a plurality of welding processes can be performed while the welding machine is operated in one direction, whereby the productivity is improved.

Figure 12:
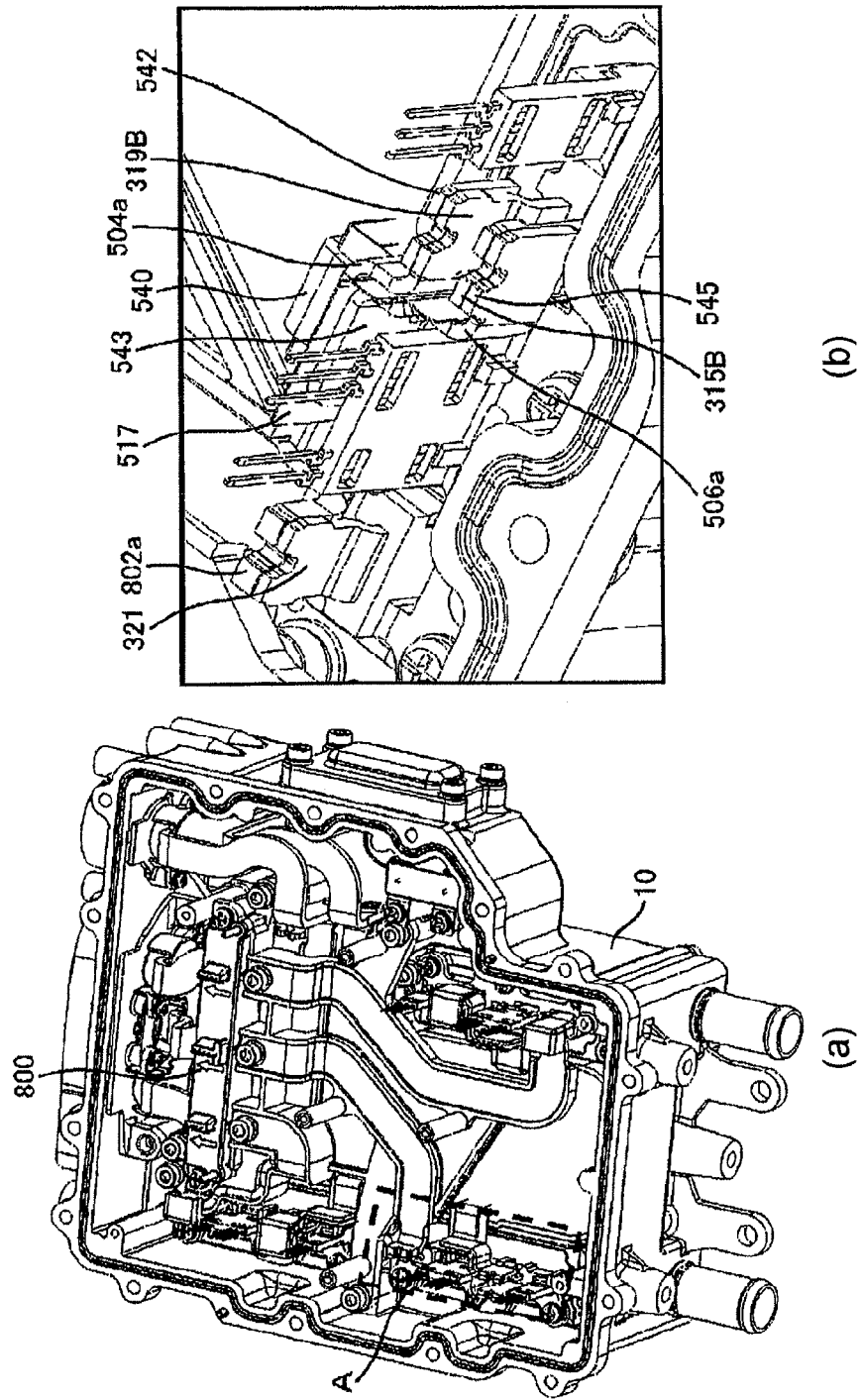
FIG. 12(a) is a perspective view that illustrates the outer appearance of power semiconductor modules 300a to 300c, the capacitor module 500, and a busbar assembly 800 imposed in the casing 10
FIG. 12(b) is an enlarged diagram of portion A illustrated in FIG. 12(a).

In addition, as illustrated in FIGS. 4 and 12, a plurality of the power semiconductor modules 300a and 300b are arranged on one straight line along a side of the casing 10 in the longitudinal direction. Accordingly, when the plurality of the power semiconductor modules 300a to 300b is welded, the productivity can be further improved.

Figure 13:
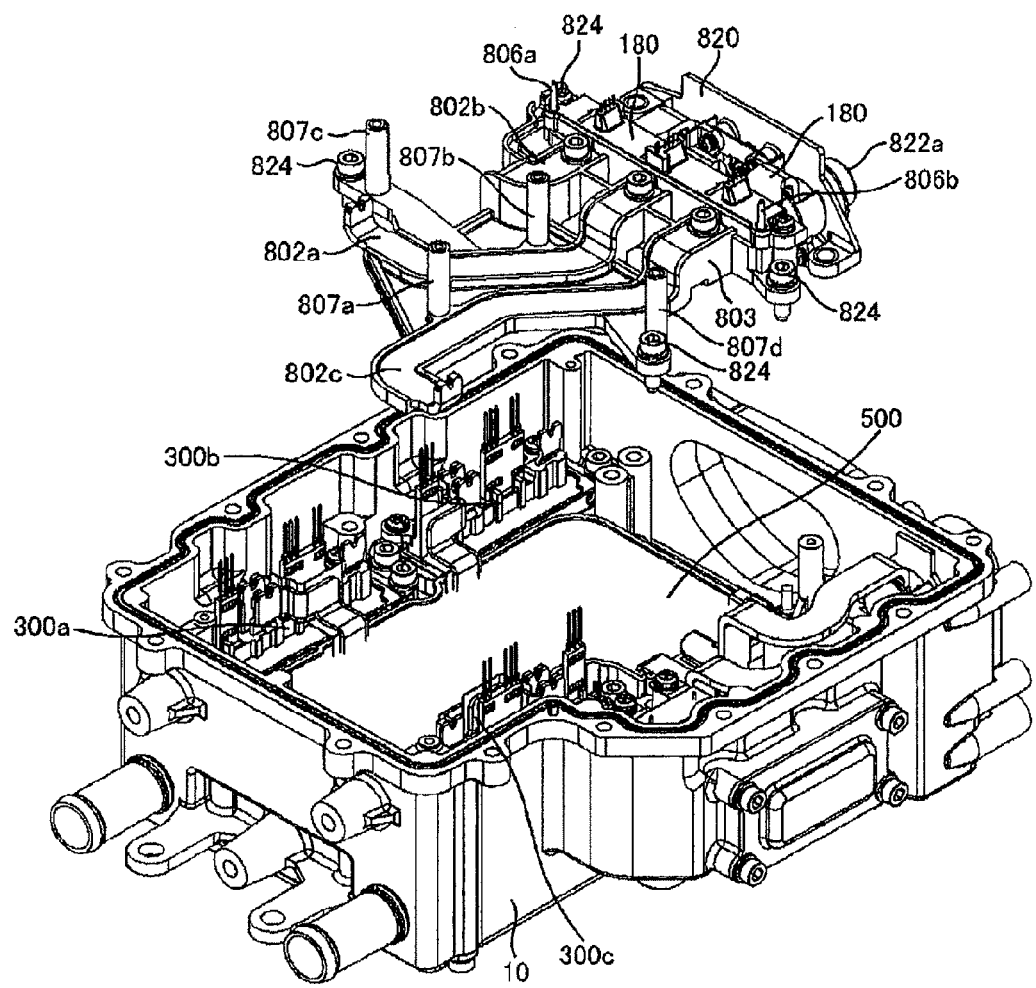
FIG. 13 is an exploded perspective view of the casing 10 in which the power semiconductor modules 300a to 300c and the capacitor module 500 are imposed and the busbar assembly 800.
Figure 14:
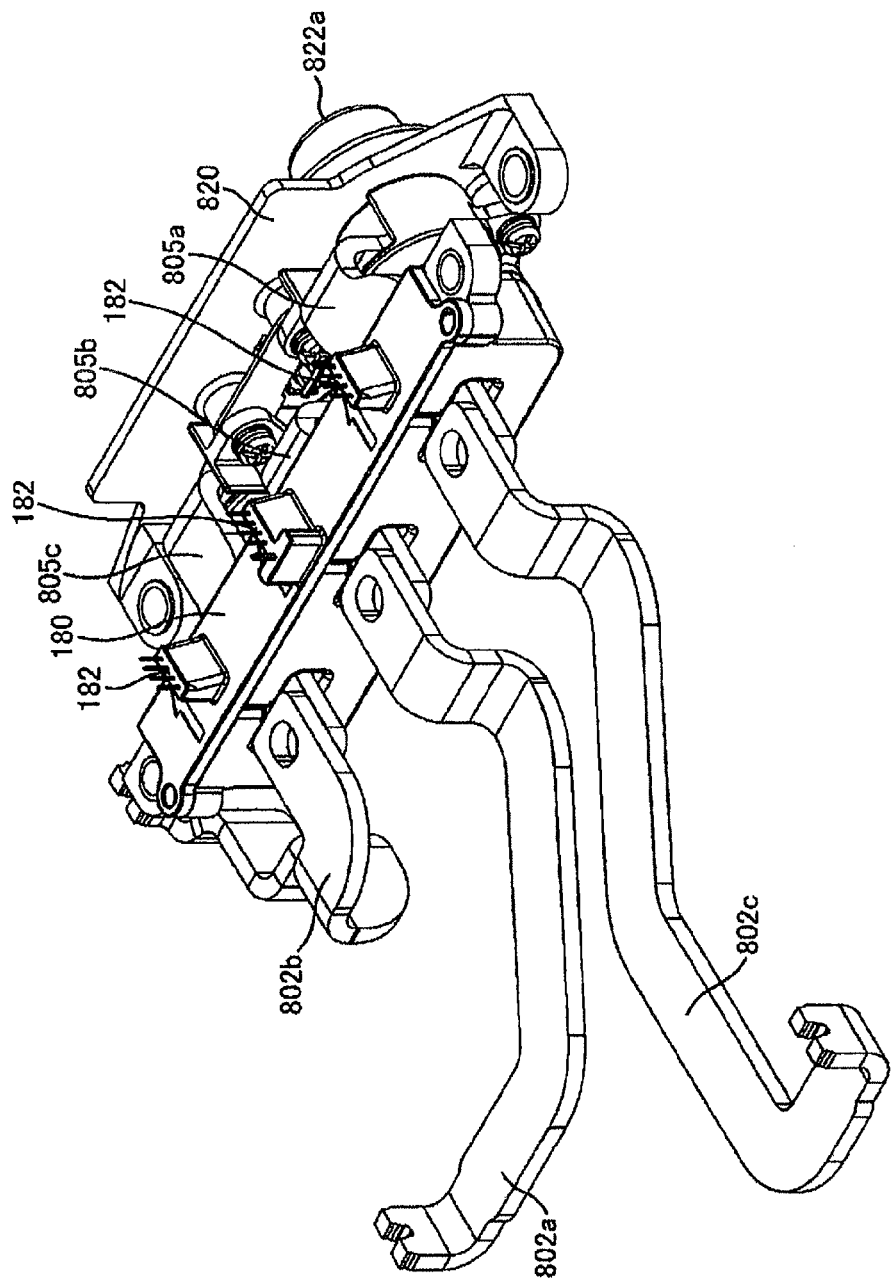
FIG. 14 is a perspective view that illustrates the outer appearance of the busbar assembly 800 from which a holder 803 is eliminated.

FIG. 13 is an exploded perspective view of the casing 10 in which the power semiconductor modules 300a to 300c and the capacitor module 500 are imposed and the busbar assembly 800. FIG. 14 is a perspective view that illustrates the outer appearance of the busbar assembly 800 from which a holder 803 is eliminated.

As illustrated in FIGS. 13 and 14, the busbar assembly 800 includes AC busbars 802a to 802c and a holder 803 that is used for holding and fixing the AC busbars 802a to 802c. In addition, in the busbar assembly 800, a current sensor 180 that is used for detecting AC currents flowing through the AC busbars 802a to 802c is disposed. Furthermore, the busbar assembly 800 includes a support member used for supporting the AC busbars 822a to 822c.

The AC busbars 802a to 802c are folded back in front of through holes of the current sensor 180 in a direction separating from the capacitor module 500 and are connected to the AC busbars 805a to 805c in front of the holes of the current sensor 180. The AC busbars 805a to 805c are connected to the AC busbars 822a to 822c after passing through the holes of the current sensor 180, respectively.

As illustrated in FIG. 13, the AC busbars 802a to 802c, the AC busbars 805a to 805c, and the current sensor 180 are held and insulated from each other by the holder 803 made of a resin.

The busbar assembly 800 is fixed to the casing 10 by the holder 803. Even in a case where heat is transferred to the casing 10 from the outside, an increase in the temperature is suppressed by the cooling block 12. By fixing the busbar assembly 800 to the casing 10 including the cooling block 12, not only an increase in the temperature of the busbar assembly 800 can be suppressed but also an increase in the temperature of the current sensor 180 held in the busbar assembly 800 can be suppressed. The current sensor 180 has a property of being vulnerable to heat, and, by employing the above-described structure, the reliability of the current sensor 180 can be improved.

As illustrated in FIG. 13, the holder 803 includes support members 807a to 807d that are used for indicating the driver circuit board 22 illustrated in FIG. 4. In distal end portions of the support members 807a to 807d, screw holes used for fixing the driver circuit board 22 are formed.

In addition, the holder 803 includes protruded portions 806a and 806b that extend from a position at which the current sensor 180 is arranged toward the upper side. The protruded portions 806a and 806b pass through the current sensor. As illustrated in FIG. 14, the current sensor 180 includes signal lines 182 that extend in the arrangement direction of the driver circuit board 22. The signal line 182 is bonded to a wiring pattern of the driver circuit board 22 through soldering. In this embodiment, the holder 803, the support members 807a to 807d, and the protruded portions 806a and 806b are integrally formed using a resin.

From this, the holder 803 has a function of positioning of the current sensor 180 and the driver circuit board 22, and accordingly, an assembly and soldering joint operation between the signal line 182 and the driver circuit board 22 can be easily performed. In addition, by arranging a mechanism that holds the current sensor 180 and the driver circuit board 22 in the holder 803, the number of components of the power inverter can be reduced as a whole. In this embodiment, since the power inverter 200 is arranged near a vibration source such as an engine, the holder 803 includes the support members 807a and 807b used for indicating a portion located near the center portion of the driver circuit board 22, whereby the influence of the vibration participating to the driver circuit board 22 is reduced. For example, by indicating the center portion of the driver circuit board 22 using the support member 808, the resonance frequency of the driver circuit board 22 can be configured to be higher than the frequency of a vibration transferred from the engine or the like, whereby the influence of the vibration of the engine or the like participating to the driver circuit board 22 can be reduced.

In addition, the holder 803 of the busbar assembly 800 is fixed to the casing 10 using a screw 824.

Figure 15:
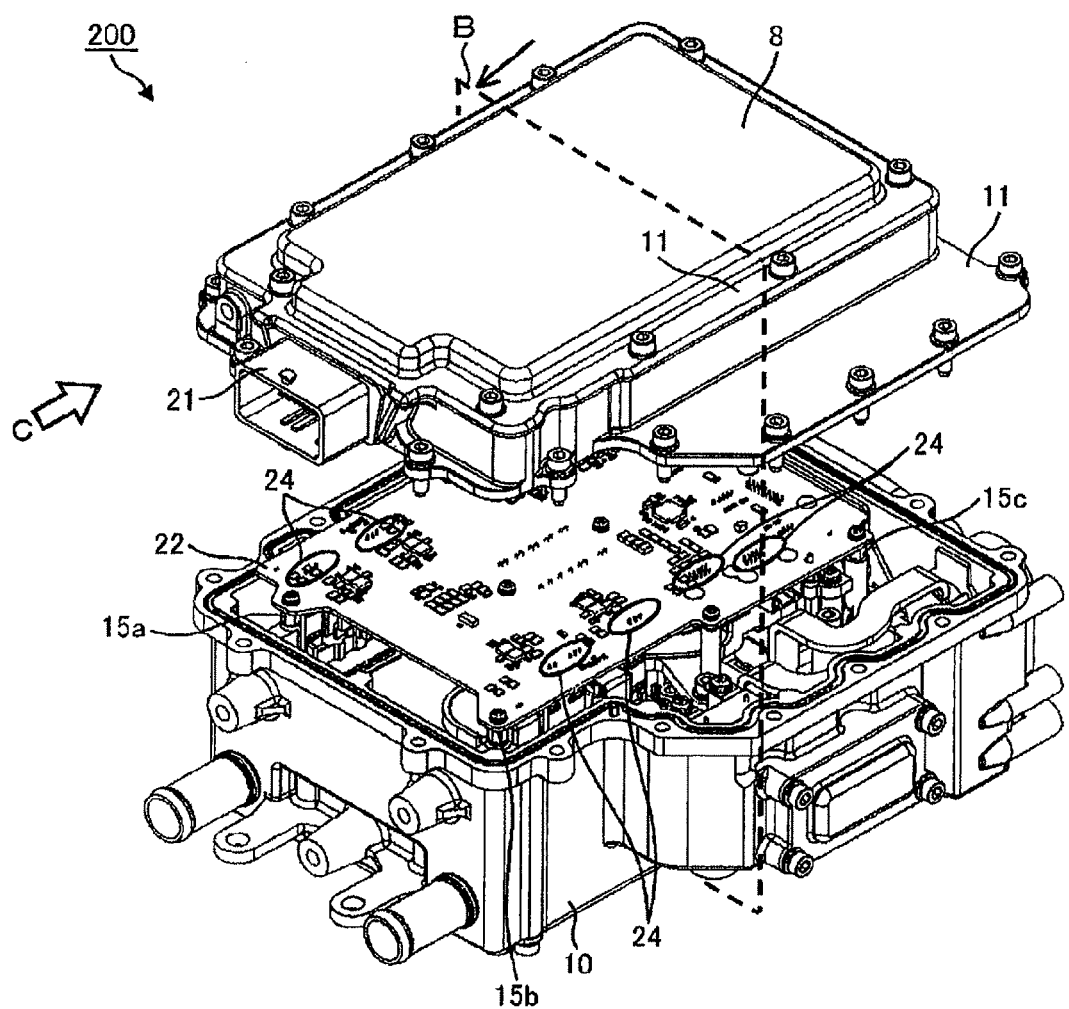
FIG. 15 is a perspective view of the power inverter 200 in a state in which a metal base plate 11 is separated therefrom.
Figure 16:
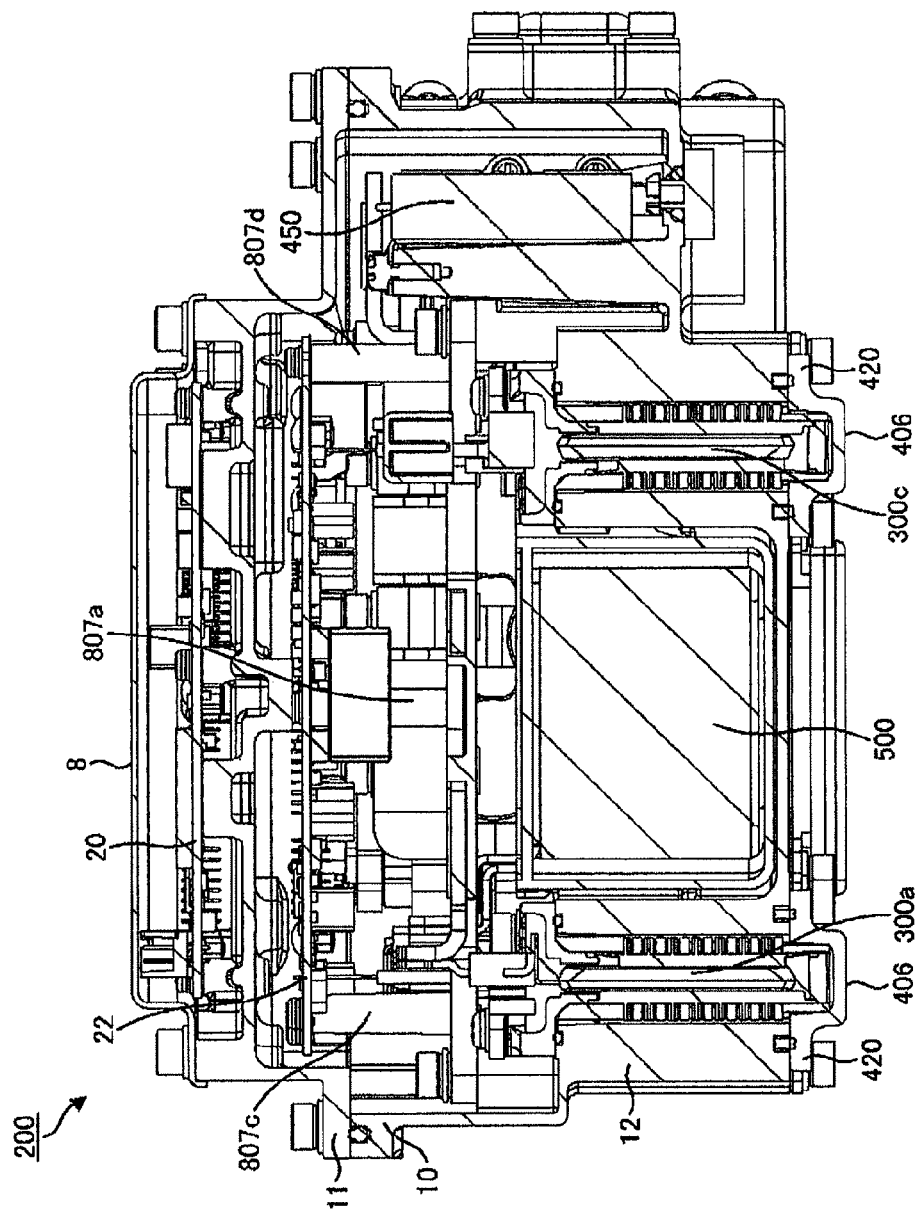
FIG. 16 is a cross-sectional view of the power inverter 200 viewed in a direction of an arrow on a cross-section B illustrated in FIG. 15.

FIG. 15 is a perspective view of the power inverter 200 in a state in which the metal base plate 11 is separated therefrom. FIG. 16 is a cross-sectional view of the power inverter 200 viewed in a direction of an arrow on a cross-section B illustrated in FIG. 15.

As illustrated in FIG. 13, the current sensor 180 is arranged on the upper side of the capacitor module 500. The driver circuit board 22 is arranged on the upper side of the current sensor 180 and is supported by the support members 807a to 807d disposed in the busbar assembly 800 illustrated in FIG. 14. In addition, four corners of the driver circuit board 22 are connected to the casing 10 through the support members 15a to 15d (15d is not illustrated in the figure).

The metal base plate 11 is arranged on the upper side of the driver circuit board 22. In this embodiment, the circumferential edge of the opening portion of the casing 10 is closed by the metal base plate 11. The control circuit board 20 is housed in a space that is formed by the metal base plate 11 and the cover 8.

The current sensor 180, the driver circuit board 22, and the control circuit board 20 are arranged in a layered manner in the height direction, and the control circuit board 20 is arranged at a position farthest from the power semiconductor modules 300a to 300c of strong electric fields, whereby mixing of a switching noise or the like can be suppressed. In addition, the metal base plate 11 is electrically connected to the cooling block 12 electrically connected to the ground. By this metal base plate 11, the noise mixed into the control circuit board 20 from the driver circuit board 22 is reduced.

By using a wiring connector, it is desirable to prevent complication of a connection process and a connection error at the time of electrically connecting the current sensor 180 and the driver circuit board 22. As illustrated in FIG. 15, the holes 24 passing through the driver circuit board 22 are formed in the driver circuit board 22. In addition, the signal terminals 325U and 325L of the power semiconductor modules 300a to 300c are inserted into the holes 24, and the signal terminals 325U and 325L are bonded by a wiring pattern of the driver circuit board 22 and soldering. In addition, soldering joints is performed from the side of a face of the driver circuit board 22 that is disposed on a side opposite to a face facing the cooling block 12.

From this, the signal lines can be connected without using wiring connectors, and accordingly, the productivity can be improved. In addition, by bonding the signal terminals 325U and 325L of the power semiconductor module 300 and the signal line 182 of the current sensor 180 through soldering in the same direction, the productivity can be further improved.

In addition, in the driver circuit board 22 of this embodiment, driving circuits (not illustrated in the figure) such as driver IC chips are mounted on the side of a face facing the cooling block 12. From this, the transfer of the heat of the soldering joint to the driver IC chip or the like is suppressed, whereby the damage in the driver IC chip or the like due to the soldering joint is prevented. Furthermore, since a high-profile component such as a transformer mounted in the driver circuit board 22 is arranged in a space between the capacitor module 500 and the driver circuit board 22, implementation of a low profile of the power inverter 200 can be performed.

Figure 17:
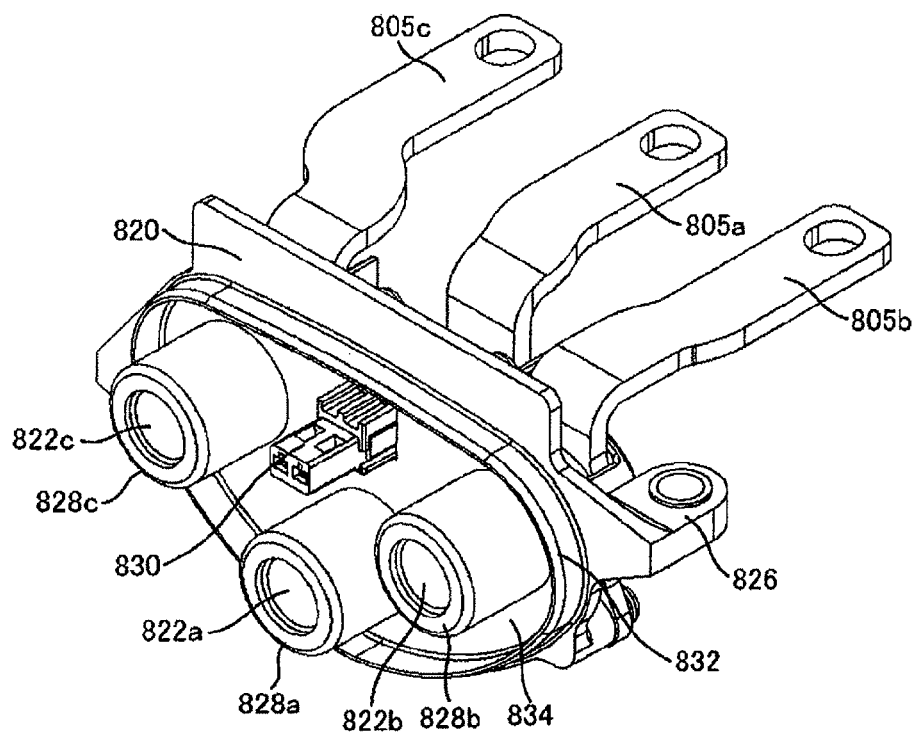
FIG. 17 is an enlarged diagram of peripheral components of the AC busbars 822a to 822c.

FIG. 17 is an enlarged diagram of peripheral components of the AC busbars 822a to 822c. The AC busbars 805a to 805c are busbars used for passing through the current sensor 180 and are supported by a first support member 820, and the distal ends thereof are connected to the AC busbars 822a to 822c. The AC busbars 822a to 822c are female-type connectors having a cylindrical shape.

The first support member 820 is fixed to the casing 10 by a fixation portion 826. In addition, the first support member 820 protrudes toward the outside of the casing 10 and includes terminal covering portions 828a to 828c that are configured by covering the distal end portions of the AC busbars 822a to 822c. The AC busbars 822a to 822c are connected to the vehicle-side connector 193 illustrated in FIG. 19. When the power inverter 200 is carried, is assembled with a vehicle, is tested, or has a component being replaced, the connector 193 is in a separated state, and there is a possibility that the AC terminals are exposed. At that time, while it is necessary to prevent an electric shock due to an operator being brought into contact with the exposed AC busbars 822a to 822c, by employing the above-described configuration, the electric shock can be prevented by covering the distal end portions of the AC busbars 822a to 822c with an insulating material.

Figure 19:
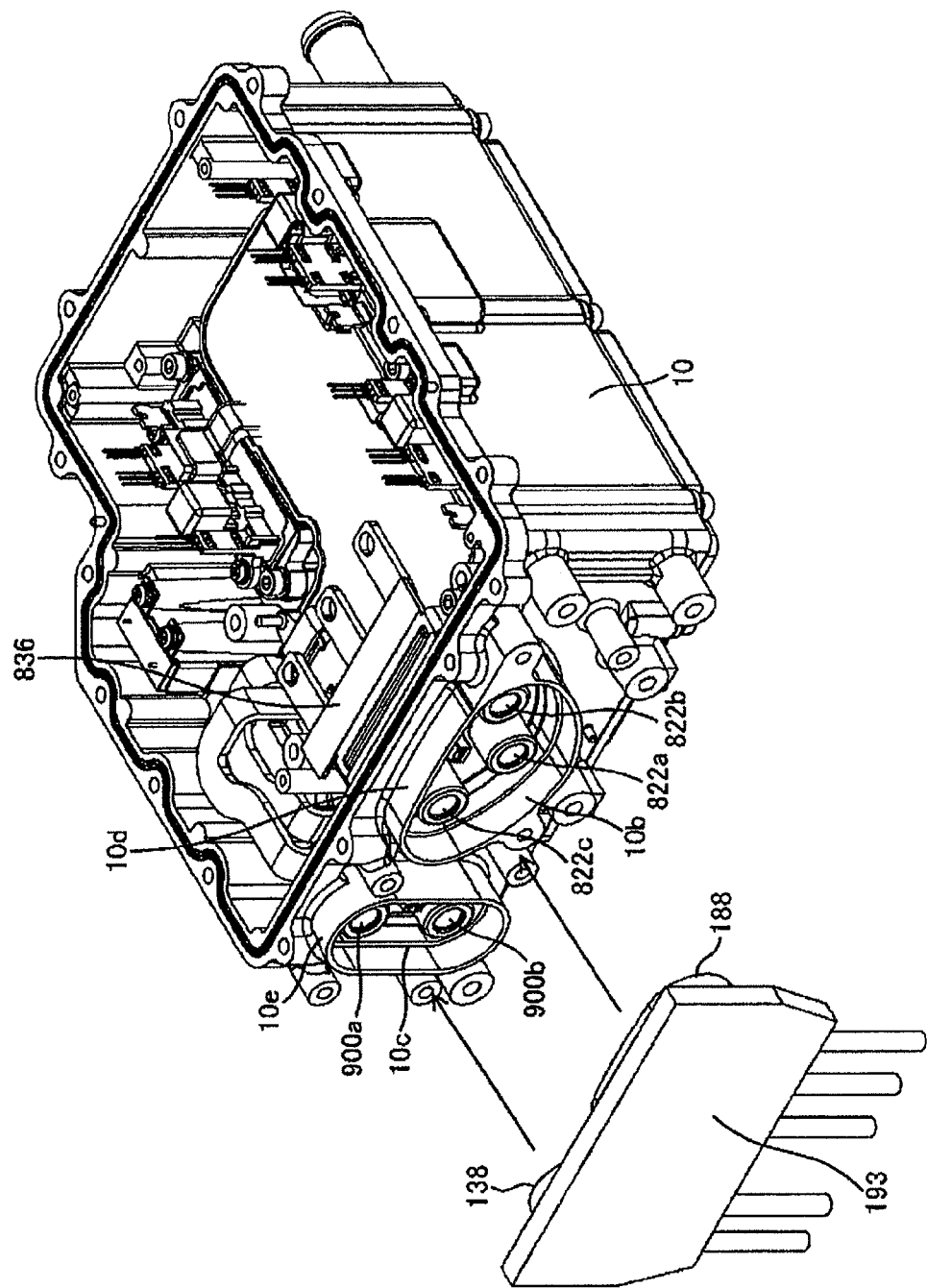
FIG. 19 is an exploded perspective view of the casing 10 in which the AC busbars 822a to 822c and the DC terminals 900a and 900b are imposed and a connector 193 disposed on a further vehicle side.

In addition, the first support member 820 holds a connection detecting circuit 830 that detects the separation of the AC connector 188 illustrated in FIG. 19 from the first support member 820, in other words, the AC connector 188 and the AC busbars 822a to 822c being in a non-electrically connected state. This connection detecting circuit 830 detects a connected state by being fitted to a connection detecting circuit similar thereto disposed on the AC connector 188 side. In a case where it is detected that the AC connector 188 and the AC busbars 822a to 822c are in the non-electrically connected state, the connection detecting circuit 830 delivers detection information to the control circuit board 20, and the control circuit board 20 performs control of driving of the power semiconductor modules 300a to 300c to be suppressed or to be stopped based on the detection information.

The connection detecting circuit 830 configures a circuit using a loop of the control circuit board 20 and the AC terminals, and the control circuit board 20 generates a signal for suppressing or stopping the driving of the power semiconductor modules when one of portions is cut off so as to be in the non-electrically connected state.

By employing the above-described configuration, when the AC busbars 822a to 822c are exposed by an operator removing the vehicle-side connector 193 when the power inverter 200 is assembled with a vehicle, is tested, or has a component being replaced, the driving of the power inverter 200 is stopped, whereby the safety of the operator can be secured. In addition, in order to prevent the driving of the power inverter 200 from being stopped at unexpected timing due to erroneously dropping out of the connection detecting circuit 830 according to a vibration, the connection detecting circuit 830 is supported by the first support member 820 that is strongly fixed to the casing 10.

In addition, the first support member 820 includes the protruded portion 832 protruding toward the outside of the casing 10. The protruded portion 832 is formed so as to surround the AC busbars 822a to 822c and is formed such that the outer periphery of the protruded portion 832 is fitted to the inner circumference portion of the opening portion 10b illustrated in FIG. 5. From this, the position accuracy of the AC busbars 822a to 822c and the inner circumference portion of the opening portion 10b can be improved. Furthermore, the waterproof effect can be improved. Furthermore, since a contact area between the first support member 820 holding the AC busbars 822a to 822c and the casing 10 can be increased much, the resonance frequency of the AC busbars 822a to 822c can be configured to be higher than the frequency of the vibration transferred from the engine or the like. Therefore, the vibration resistance of the periphery of the AC busbars 822a to 822c can be improved.

In addition, the first support member 820 includes a shielding portion 834 that is used for closing the opening portion 10b of the casing 10. The shielding portion 834 is formed so as to be imbedded between terminal covering portions 828a to 828c and the protruded portion 832. When only the power inverter 200 is carried, is assembled with a vehicle, is tested, or has a component being replaced, there is a possibility that a foreign material such as a screw or a tool is mixed into the inside of the casing 10 from the outside. The foreign material mixed into the inside of the casing 10 may lead to a formation of a short circuit in an electrically connected potion or a damage in a constituent component, and there is a possibility that the power inverter 200 is broken down. Thus, as in the above-described configuration, by shielding the inside and the outside of the casing 10 using the shielding portion 834, the mixing of a foreign material from the outside can be prevented.

Figure 18:
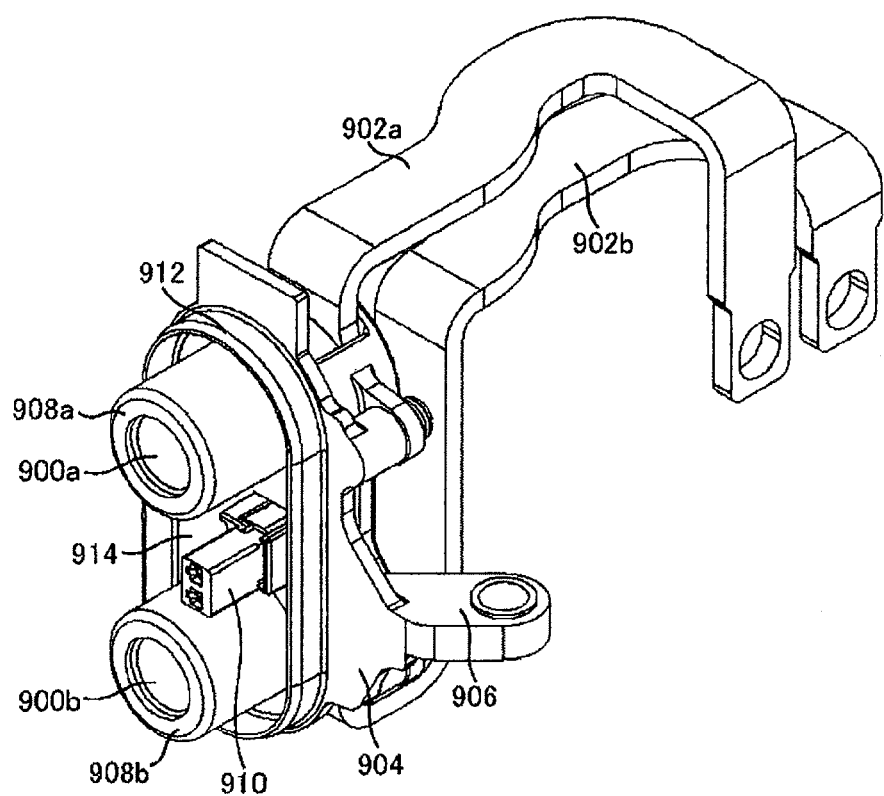
FIG. 18 is an enlarged diagram of peripheral components of a negative-side DC terminal 900a and a positive-side DC terminal 900b.

FIG. 18 is an enlarged diagram of peripheral components of the DC terminal 900a disposed on a negative side and the DC terminal 900b disposed on a positive side.

The negative-side DC busbar 902a has one distal end connected to the negative-side power source terminal 508 of the capacitor module 500 and one distal end connected to the DC terminal 900a. Similarly, the positive-side DC busbar 902b has one distal end connected to the positive-side power source terminal 509 of the capacitor module 500 and one distal end connected to the DC terminal 900b. The DC terminals 900a and 900b are female-type connectors having a cylindrical shape.

The second support member 904 is fixed to the casing 10 by a fixation portion 906. In addition, the second support member 904 protrudes toward the outside of the casing 10 and includes terminal covering portions 908a and 908b configured by covering the distal end portions of the DC terminals 900a and 900b. The DC terminals 900a and 900b are connected to the vehicle-side connector 193 illustrated in FIG. 19. When the power inverter 200 is carried, is assembled with a vehicle, is tested, or has a component being replaced, the connector 193 is in a separated state, and there is a possibility that the DC terminals are exposed. At that time, while it is necessary to prevent an electric shock due to an operator being brought into contact with the exposed DC terminals 900a and 900b, by employing the above-described configuration, the electric shock can be prevented by covering the distal end portions of the DC terminals 900a and 900b with an insulating material.

In addition, the second support member 904 holds a connection detecting circuit 910 that detects the separation of the DC-side connector 138 illustrated in FIG. 19 from the second support member 904, in other words, the DC-side connector 138 and the DC terminals 900a and 900b being in a non-electrically connected state. This connection detecting circuit 910 detects a connected state by being fitted to a connection detecting circuit similar thereto disposed on the DC-side connector 138 side. In a case where it is detected that the DC-side connector 138 and the DC terminals 900a and 900b are in the non-electrically connected state, the connection detecting circuit 910 delivers detection information to the control circuit board 20, and the control circuit board 20 performs control of driving of the power inverter 200 to be suppressed or to be stopped based on the detection information.

In addition, the connection detecting circuit 830 configures a circuit using a loop of the control circuit board 20 and the DC terminals, and the control circuit board 20 generates a signal for suppressing or stopping the driving of the power semiconductor modules when one of portions is cut off so as to be in the non-electrically connected state.

In this embodiment, the connection detecting circuit 830 is arranged also on the side of the AC busbars 822a to 822, a circuit is configured by a loop between the control circuit board 20, the DC terminals, and the AC terminals, and, when one of portions is cut off so as to be in the non-electrically connected state, the control circuit board 20 is configured to generate a signal for suppressing or stopping the driving of the power semiconductor modules. In addition, as illustrated in FIG. 19, in a case where the connector 193 is configured such that the DC-side connectors 138 and the AC connectors 188 are integrated, if one of the connection detecting circuits 830 and 910 is disposed, the control for suppressing or stopping the driving of the power inverter 200 can be performed.

By employing the above-described configuration, when the DC terminals 900a and 900b are exposed by an operator removing the vehicle-side connector 193 when the power inverter 200 is assembled with a vehicle, is tested, or has a component being replaced, the driving of the power inverter 200 is stopped, whereby the safety of the operator can be secured. In addition, in order to prevent the driving of the power inverter 200 from being stopped at unexpected timing due to erroneously dropping out of the connection detecting circuit 910 according to a vibration, the connection detecting circuit 910 is supported by the second support member 904 that is strongly fixed to the casing 10.

In addition, the second support member 904 includes the protruded portion 912 protruding toward the outside of the casing 10. The protruded portion 912 is formed so as to surround the DC terminals 900a and 900b and is formed such that the outer periphery of the protruded portion 832 is fitted to the inner edge of the opening portion 10c illustrated in FIG. 5. From this, the position accuracy of the DC terminals 900a and 900b and the inner circumference portion of the opening portion 10c can be improved. Furthermore, the waterproof effect can be improved. Furthermore, since a contact area between the second support member 904 holding the DC terminals 900a and 900b and the casing 10 can be increased much, the resonance frequency of the DC terminals 900a and 900b can be configured to be higher than the frequency of the vibration transferred from the engine or the like. Therefore, the vibration resistance of the periphery of the DC terminals 900a and 900b can be improved.

In addition, the second support member 904 includes a shielding portion 914 that is used for closing the opening portion 10c of the casing 10. The shielding portion 914 is formed so as to be imbedded between terminal covering portions 908a and 908b and the protruded portion 912. When only the power inverter 200 is carried, is assembled with a vehicle, is tested, or has a component being replaced, there is a possibility that a foreign material such as a screw or a tool is mixed into the inside of the casing 10 from the outside. The foreign material mixed into the inside of the casing 10 may lead to a formation of a short circuit in an electrically connected portion or a damage in a constituent component, and there is a possibility that the power inverter 200 is broken down. Thus, as in the above-described configuration, by shielding the inside and the outside of the casing 10 using the shielding portion 914, the mixing of a foreign material from the outside can be prevented.

FIG. 19 is an exploded perspective view of the casing 10 in which the AC busbars 822a to 822c and the DC terminals 900a and 900b are imposed and a connector 193 disposed on a further vehicle side.

The casing 10 includes a first wall 10d that protrudes from the edge of the opening portion 10b toward the outside of the casing 10. The first wall 10d may be formed to be integrated with the casing 10. The AC-side connector 188 passes through a space surrounded by the first wall 10d and is connected to the AC busbars 822a to 822c supported by the first support member 820. From this, the AC busbars 822a to 822c are covered with the first wall 10d, and accordingly, the AC busbars 822a to 822c can be protected from a shock transferred from the outside. In addition, by bringing a protruded portion 832 of the first support member 820 and the first wall 10d into contact with each other in a broad area, the accuracy of the positions of the AC busbars 822a to 822c can be improved, and the resonance frequency of the AC busbars 822a to 822c can be configured to be higher than the frequency of a vibration transferred from the engine or the like. Furthermore, since the AC-side connector 188 is configured to be in contact with the inner periphery of the first wall 10d, the accuracy of the position of the AC-side connector 188 can be improved, and the resonance frequency of the AC wiring of the AC-side connector 188 can be configured to be higher than the frequency of the vibration transferred from the engine or the like.

Similarly, the casing 10 includes a second wall 10e that protrudes from the edge of the opening portion 10c toward the outside of the casing 10. The second wall 10e may be formed to be integrated with the casing 10. The DC-side connector 138 passes through a space surrounded by the second wall 10e and is connected to the DC terminals 900a and 900b supported by the second support member 904. From this, the DC terminals 900a and 900b are covered with the second wall 10e, and accordingly, the DC terminals 900a and 900b can be protected from a shock transferred from the outside. In addition, by bringing the protruded portion 912 of the second support member 904 and the second wall 10e into contact with each other in a broad area, the accuracy of the positions of the DC terminals 900a and 900b can be improved, and the resonance frequency of the DC terminals 900a and 900b can be configured to be higher than the frequency of a vibration transferred from the engine or the like. Furthermore, since the DC-side connector 138 is configured to be in contact with the inner periphery of the second wall 10e, the accuracy of the position of the DC-side connector 138 can be improved, and the resonance frequency of the DC wiring of the DC-side connector 138 can be configured to be higher than the frequency of the vibration transferred from the engine or the like.

The metal plate 836 is a member that is used for fixing the first support member 820 to the casing 10 by interposing the first support member 820 between the casing 10 and the metal plate 836. This metal plate 836 is formed so as to cover at least a part of the face of the AC busbars 822a to 822c on a side on which the control circuit board 20 illustrated in FIG. 4 is arranged. The control circuit board 20 and the wiring used for transferring a control signal may be easily influenced by a noise transmitted from the AC busbars 822a to 822c or the AC busbars 805a to 805c due to a weak current. Thus, by surrounding the AC busbars 822a to 822c and the AC busbars 805a to 805c using the metal plate 836 that is a conductive member, a noise can be blocked.

In this embodiment, the connector 193 is configured to be integrated with the DC-side connector 138 and the AC connector 188. From this, the number of components can be reduced, and the connection operation can be simplified, whereby the productivity is improved. However, since the DC-side connectors 138 and the AC connectors 188 are attached to one side altogether, the connector 193 is formed to be large and may be easily distorted, whereby there is concern that the insertion stress of the connector 193 is biased. As a result, there is a concern that the connector 193 or the components of the power inverter 200 may be damaged or the waterproof property may be degraded due to deviation of a sealing member between the connector 193 and the casing 10. In addition, when the connector 193 and the power inverter 200 are mounted in a vehicle in the state in which the insertion stress of the connector 193 is biased, there is a concern that the required capability of the vibration resistance may not be acquired.

Figure 20:
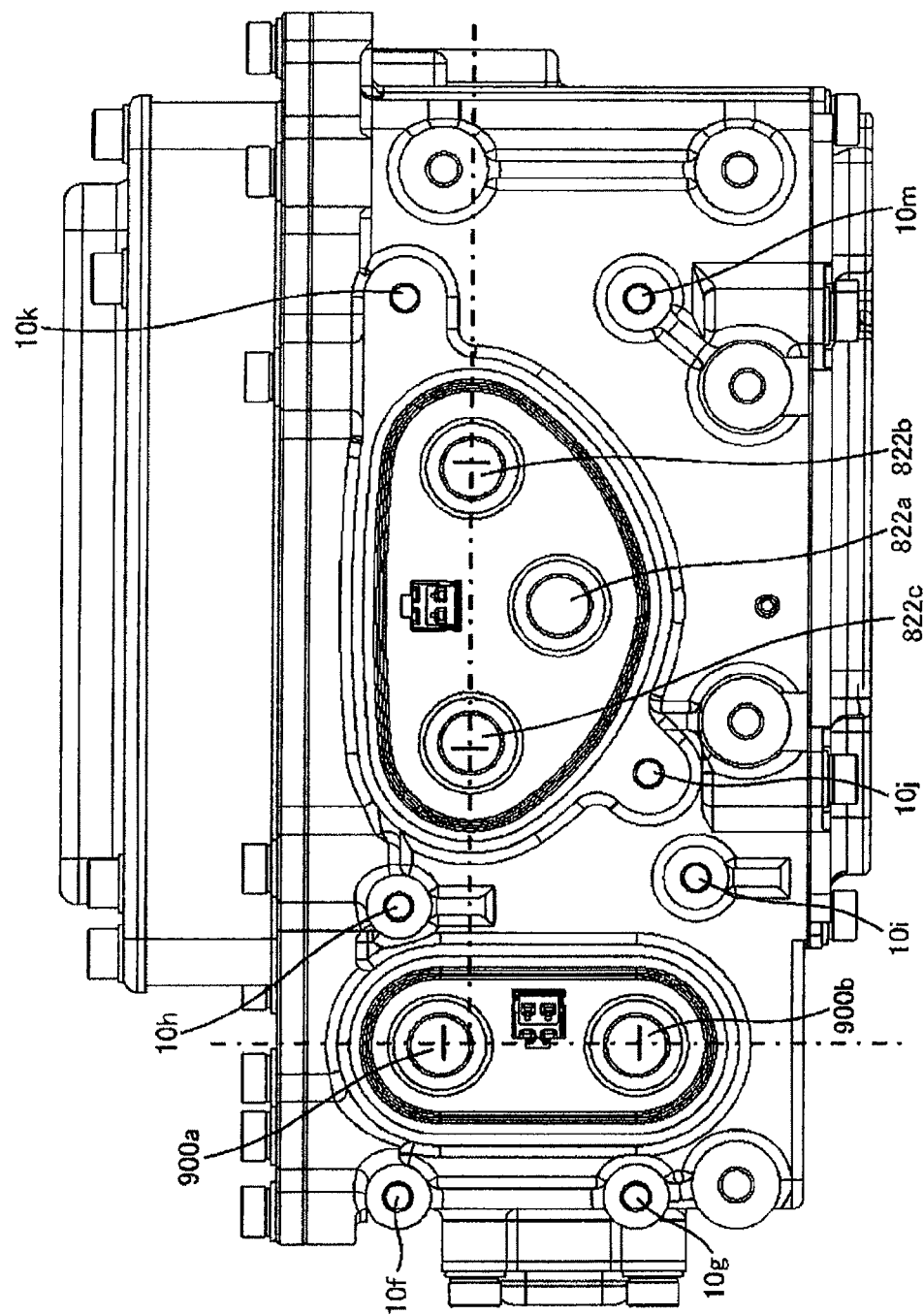
FIG. 20 is a side view of the casing 10 viewed from the side on which the AC busbars 822a to 822c and the DC terminal 900a are arranged.

Thus, the AC busbars 822a to 822c and the DC terminals 900a and 900b according to this embodiment are arranged such that the distortion of the connector 193 in which the DC-side connector 138 and the AC connector 188 are integrally configured is reduced. More specifically, as illustrated in FIG. 20, the AC busbars 822a to 822c and the DC terminals 900a and 900b are arranged on one side face of the casing 10, and one side face of the casing 10 forms a rectangular shape configured by sides in the direction of shorter sides and sides in the longitudinal direction. In addition, the DC terminals 900a and 900b are arranged to be aligned along one side of one side face of the casing 10 in the direction of the shorter side, and the AC busbars 822a to 822c are arranged to be aligned along one side of one side face of the casing 10 in the longitudinal direction.

Accordingly, an approximate letter "T" inclined by 90 degrees or an approximate letter "L" is formed by a segment passing through the DC terminals 900a and 900b and a segment passing through the AC busbars 822a and 822c. Therefore, the positioning of the connector 193 in the height direction (the direction of the shorter side of one side face of the casing 10) and the widthwise direction (the longitudinal direction of one side face of the casing 10) are simultaneously performed, and the connector 193 can be fixed to each terminal and the casing 10 such that the insertion stress of the connector 193 is not biased. In addition, since an extreme increase in the length of the connector 193 in the height direction or the widthwise direction is suppressed, the distortion of the connector 193 can be reduced, and the bias of the insertion stress of the connector 193 is reduced. In addition, since an extreme increase in the length of the connector 193 in the height direction or the widthwise direction is suppressed, distances between connector fixation portions 10f to 10m can be shortened. From this, the resonance frequency of the connector 193 and the casing 10 can be configured to be higher than the frequency of the vibration transferred from the engine or the like, whereby the vibration resistance of the vehicle can be improved.

In addition, in this embodiment, the AC busbar 822b is arranged to be closer to the other side of one side face of the casing 10 in the longitudinal direction than the AC busbars 822a and 822c. In accordance with such an arrangement, the first support member 820 and the first wall 10d form an inverted triangle shape having a gentle angle. From this, extreme increases in the lengths of the AC connector 188 and the connector 193 in the height direction or the widthwise direction are suppressed, whereby advantages of improving the connection reliability and the vibration resistance as described above are acquired.

The entire contents of the following application on which priority is based are incorporated herein by reference. Japanese Patent Application No. 2010-289091 (Filed on Dec. 27, 2010)

The invention claimed is:

1. A power inverter that fixes a connector, in which a DC-side connector and an AC-side connector are mechanically combined, to a casing, the power inverter comprising:
    a power semiconductor module that converts a DC current into an AC current;
    a DC terminal that delivers the DC current to the power semiconductor module;
    an AC terminal that delivers the AC current to an electrical motor; and
    the casing that houses the power semiconductor module, wherein
    the DC terminal and the AC terminal are arranged on one side face of the casing,
    the one side face of the casing forms a rectangular shape that is configured by a side formed in a widthwise direction and a side formed in a longitudinal direction,
    the DC terminal is configured by a positive-side DC terminal and a negative-side DC terminal,
    the AC terminal is configured by a U-phase side terminal, a V-phase side terminal, and a W-phase side terminal,
    the positive-side DC terminal and the negative-side DC terminal are arranged to be aligned along one side, which is formed in the widthwise direction, of the one side face of the casing, and
    the U-phase side terminal, the V-phase side terminal, and the W-phase side terminal are arranged to be aligned along one side, which is formed in the longitudinal direction, of the one side face of the casing.

2. The power inverter according to claim 1, wherein one of the U-phase side terminal, the V-phase side terminal, and the W-phase side terminal is arranged to be closer to the other side, which is formed in the longitudinal direction, of the one side face of the casing than the other two terminals.

3. The power inverter according to claim 1, further comprising a first support member that supports the AC terminal, wherein
    the casing forms a first opening portion on the one side face, and
    the first support member closes the first opening portion from an inner wall side of the casing and is supported by the inner wall of the casing.

4. The power inverter according to claim 3, wherein
    the casing includes a first wall that protrudes from an edge of the first opening portion toward an outside of the casing, and
    the AC-side connector of the connectors passes through a space surrounded by the first wall and is connected to the AC terminal supported by the first support member.

5. The power inverter according to claim 3, further comprising a second support member that supports the DC terminal, wherein
    the casing forms a second opening portion on the one side face, and
    the second support member closes the second opening portion from the inner wall side of the casing and is supported by the inner wall of the casing.

6. The power inverter according to claim 5, wherein
    the casing includes a second wall that protrudes from an edge of the second opening portion toward the outside of the casing, and
    the DC-side connector of the connectors passes through a space surrounded by the second wall and is connected to the DC terminal supported by the second support member.

7. The power inverter according to claim 5, further comprising:
    a control circuit board that controls driving of the power semiconductor module; and
    a connection detecting circuit that detects a state in which the connector is electrically disconnected from the DC terminal and the AC terminal, wherein
    the connection detecting circuit is connected to at least one of the first support member and the second support member, and
    the control circuit board suppresses or stops the driving of the power semiconductor module based on a signal transmitted from the connection detecting circuit.

8. The power inverter according to claim 3, wherein
    the first support member includes a first protruded portion that protrudes toward the outside of the casing, and
    the first support member is fixed to the inner wall of the casing in a state in which the first protruded portion is brought into contact with an inner circumference portion of the first opening portion of the casing.

9. The power inverter according to claim 1, further comprising a first support member that supports the AC terminal, wherein
    the casing forms a first opening portion on the one side face,
    the first support member is supported by the inner wall side of the casing at a position facing the first opening portion, and
    the first support member includes a terminal covering portion that protrudes toward the outside of the casing and is configured to cover a distal end portion of the AC terminal.

10. The power inverter according to claim 1, further comprising:
    a control circuit board that controls driving of the power semiconductor module;
    an AC busbar that delivers the AC current flowing between the power semiconductor module and the AC terminal;
    a first support member that supports the AC terminal; and
    a metal plate that fixes the first support member to the casing by sandwiching the first support member between the casing and the metal plate, wherein
    the casing forms a first opening portion on the one side face,
    the first support member is supported by the inner wall side of the casing at a position facing the first opening portion, and the metal plate is formed to cover at least a part of a face of the AC busbar disposed on a side on which the control circuit board is arranged.

11. The power inverter according to claim 2, further comprising a first support member that supports the AC terminal, wherein the casing forms a first opening portion on the one side face, and the first support member closes the first opening portion from an inner wall side of the casing and is supported by the inner wall of the casing.

* * * * *